United States Patent
Nakamura et al.

(10) Patent No.: US 6,770,422 B2
(45) Date of Patent: *Aug. 3, 2004

(54) NEGATIVE IMAGE-RECORDING MATERIAL AND METHOD OF IMAGE FORMATION

(75) Inventors: Ippei Nakamura, Shizuoka-ken (JP); Tadahiro Sorori, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/899,123

(22) Filed: Jul. 6, 2001

(65) Prior Publication Data

US 2002/0045128 A1 Apr. 18, 2002

(30) Foreign Application Priority Data

Jul. 25, 2000 (JP) ........................................ 2000-224031

(51) Int. Cl.[7] .............................................. G03F 7/029
(52) U.S. Cl. .............................. 430/286.1; 430/287.1; 430/302; 430/309; 430/434; 430/348; 430/944
(58) Field of Search .................... 430/270.1, 281.1, 430/286.1, 287.1, 302, 348, 944, 964, 945, 309, 434

(56) References Cited

U.S. PATENT DOCUMENTS

| | | | | | |
|---|---|---|---|---|---|
| 4,800,149 | A | * | 1/1989 | Gottschalk et al. | 430/138 |
| 4,859,572 | A | * | 8/1989 | Farid et al. | 430/281 |
| 4,971,892 | A | * | 11/1990 | Ali et al. | 430/281 |
| 5,093,492 | A | * | 3/1992 | Acker et al. | 544/123 |
| 5,151,520 | A | * | 9/1992 | Gottschalk et al. | 548/110 |
| 5,658,708 | A | | 8/1997 | Kondo | |
| 5,672,463 | A | | 9/1997 | Hozumi et al. | |
| 5,719,008 | A | | 2/1998 | Hozumi et al. | |
| 5,814,431 | A | * | 9/1998 | Nagasaka et al. | 430/281.1 |
| 6,096,794 | A | | 8/2000 | Cunningham et al. | |
| 6,159,657 | A | * | 12/2000 | Fleming et al. | 430/270.1 |
| 6,235,451 | B1 | * | 5/2001 | Damme et al. | 430/302 |
| 6,306,555 | B1 | | 10/2001 | Schulz et al. | |
| 6,322,950 | B1 | * | 11/2001 | Sorori et al. | 430/281.1 |
| 6,383,717 | B1 | * | 5/2002 | Fiebag et al. | 430/302 |
| 6,410,202 | B1 | * | 6/2002 | Fleming et al. | 430/270.1 |
| 6,423,462 | B1 | * | 7/2002 | Kunita | 430/156 |
| 6,423,467 | B1 | | 7/2002 | Kawauchi et al. | |
| 6,423,469 | B1 | * | 7/2002 | DoMinh et al. | 430/270.1 |
| 6,447,979 | B1 | | 9/2002 | Hattori et al. | |
| 6,492,093 | B2 | * | 12/2002 | Schlosser et al. | 430/271.1 |
| 6,602,648 | B2 | | 8/2003 | Nakamura | |
| 2001/0008748 | A1 | * | 7/2001 | Busman et al. | 430/325 |
| 2002/0051934 | A1 | * | 5/2002 | Nakamura et al. | 430/270.1 |
| 2002/0197564 | A1 | * | 12/2002 | Timpe et al. | 430/284.1 |
| 2003/0003399 | A1 | * | 1/2003 | Muller et al. | 430/287.1 |

FOREIGN PATENT DOCUMENTS

| | | | | |
|---|---|---|---|---|
| EP | 0 949 539 A2 | | 10/1999 | |
| EP | 1 096 315 A1 | * | 5/2001 | ........... G03F/7/029 |
| JP | 2001-125260 | * | 5/2001 | ........... G03F/7/004 |

* cited by examiner

Primary Examiner—Mark F. Huff
Assistant Examiner—Barbara Gilliam
(74) Attorney, Agent, or Firm—Burns, Doane, Swecker & Mathis, LLP

(57) ABSTRACT

A negative image-recording material which can be imagewise-exposed by IR radiation from IR lasers and enables direct image formation from digital data of a computer or the like. The material, when used in a lithographic printing plate, ensures good hardenability in an image area, exhibits good printing durability, even if not heated for image-formation, and ensures a large number of good prints from the printing plate. The material includes (A) an IR absorber having an oxidation potential of at most 0.35 V (vs. SCE), (B) a thermal radical generator and (C) a radical-polymerizing compound. The material is imagewise-exposed to IR radiation for image formation. Preferably, the IR absorber (A) has, in a chromophoric group, an electron-donating substituent having a Hammett's σpara value of at most −0.10, and the thermal radical generator (B) is an onium salt.

24 Claims, No Drawings

NEGATIVE IMAGE-RECORDING MATERIAL AND METHOD OF IMAGE FORMATION

BACKGROUND OF THE INVENTION

1. Field of the Invention

The present invention relates to an image-recording material usable for lithographic printing plates, color proofs, photoresists and color filters. In particular, the present invention relates to a negative image-recording material for heat-mode exposure, which can be directly processed by scanning thereon an IR laser on the basis of digital signals from a computer or the like, and which is therefore usable for directly-processable recording layers for lithographic printing plates, and relates to a method of forming an image on the recording material.

2. Description of the Related Art

As a system for directly processing a recording material from digital data of a computer, heretofore proposed have been <1> electrophotography, <2> exposure of photopolymerization materials to blue or green-emitting lasers, <3> silver salt lamination on photosensitive resin, and <4> silver salt diffusion transfer photography.

However, these all have some drawbacks. Specifically, the image-forming process of electrophotography <1> is troublesome, in comprising complicated steps of electric charging, exposure to light and development, and this requires a complicated large-scale apparatus. Photopolymerizable plates for <2> are highly sensitive to blue and green light, and are difficult to handle in light rooms. In the processes for <3> and <4> using silver salts, development is troublesome and, in addition, wastes contain silver.

On the other hand, the recent development of laser technology is remarkable, and high-power and small-sized solid lasers and semiconductor lasers for emitting IR radiation within a wavelength range of from 760 nm to 1200 nm are easily available. For a light source for directly processing a recording material from the digital data of a computer or the like, these lasers are extremely useful. However, many practicable photosensitive recording materials are sensitive to visible light falling within a wavelength range of at most 760 nm, to which, therefore, these IR lasers are not applicable for recording images thereon. Accordingly, recording materials capable of being processed with IR lasers are desired.

An image-recording material capable of being processed with an IR laser is described in U.S. Pat. No. 4,708,925, which comprises an onium salt, a phenolic resin and a color sensitizer. This is a positive image-recording material, in which the onium salt and the phenolic resin express dissolution resistance to developers, and this is not a negative image-recording material as in the present invention. On the other hand, a negative image-recording material is disclosed in U.S. Pat. No. 5,340,699, which comprises an IR absorber, an acid generator, a resol resin and a novolak resin. For image formation thereon, however, this requires heat treatment after exposure to a laser. Therefore, a negative image-recording material not requiring heat treatment after exposure to light is desired.

For example, Japanese Patent Application Publication (JP-B) No. 7-103171 discloses a recording material that comprises a cyanine dye having a specific structure, an iodonium salt, and an ethylenically unsaturated double bond-containing, addition-polymerizable compound. This does not require heat treatment after imagewise exposure to light. However, the strength of the image area of this material is low. Therefore, this is unfavorable to lithographic printing plates, as the number of prints from a lithographic printing plate using this material is small.

SUMMARY OF THE INVENTION

An object of the present invention is to provide a negative image-recording material which can be imagewise exposed to IR radiation from an IR-emitting solid laser or semiconductor laser and which enables direct image formation thereon from digital data of a computer or the like, and which, when used in a lithographic printing plate, ensures good hardenability in an image area and exhibits good printing durability, even if not heated for image formation thereon, and ensures a large number of good prints from the printing plate.

Having specifically noted the constituent components of negative image-recording materials and having assiduously studied them, the present inventors have found that the above-mentioned object can be attained when an IR absorber having a specific oxidation potential is used. On the basis of this finding, the present invention has been completed.

The present invention provides a negative image-recording material, which comprises (A) an IR absorber, (B) a thermal radical generator such as typically an onium salt and (C) a radical-polymerizing compound, and is imagewise exposed to IR radiation for image formation thereon, and in which the IR absorber (A) has an oxidation potential of at most 0.45 V (vs. SCE).

Though not clear, the advantages of the negative image-recording material of the present invention may result from the IR absorber having a low oxidation potential in the material. In the recording material, the IR absorber having a low oxidation potential will promote decomposition of the thermal radical generator, and will therefore promote polymerization of the radical-polymerizing compound therein, to thereby enhance the mechanical strength of the image-recorded layer of the material, and, as a result, the printing durability of the material when used in printing plates may be enhanced. The reason for this may be that the donor property of the IR absorber having a low oxidation potential is good. Therefore, in the material, the radical generator is readily decomposed through ordinary light-heat conversion, and, in addition, it will easily react with the IR absorber having such a good donor property to form an intermediate of the radical generator and the IR absorber (this intermediate will participate in the decomposition of the radical generator).

The recording material of the present invention is for "heat-mode exposure", and this means that the recording material is subjected to heat-mode exposure for image formation thereon. The definition of heat-mode exposure is described in detail below. As in Hans-Joachim Timpe, IS & Ts NIP 15:1999 *International Conference on Digital Printing Technologies*, page 209, it is known that, with regard to a process comprising photo-excitation of a light-absorbing substance (e.g., dye) in a photographic material followed by chemical or physical change thereof for image formation in a layer of the material, the process of image formation comprising photo-excitation of the light-absorbing substance followed by chemical or physical change thereof includes two major modes. Specifically, one is a photon mode in which the photo-excited light-absorbing substance in a photographic material is inactivated through some photo-chemical interaction (for example, energy transfer or electron transfer) with the other reactive substance in the material, and the reactive substance having been thus activated as a result of the interaction undergoes chemical or physical change necessary for image formation in a layer of the material; and the other is a heat mode in which the photo-excited light-absorbing substance in a photographic material generates heat and is thus inactivated through the heat generation, and the other reactive substance in the material receives the heat and undergoes chemical or physical change necessary for image formation in a layer of the material. Other minor modes of the process are omitted herein; for example, ablation, in which the substances in a photographic material are explosively scattered by some locally focused light energy, and multiphoton absorption, in which one molecule in a photographic material absorbs a number of photons all at a time.

The modes of the exposure process are referred to as photon-mode exposure and heat-mode exposure. The technical difference between photon-mode exposure and heat-mode exposure is whether or not energy quantities from a plurality of photons for exposure can be added up for the intended reaction. For example, referred to is a reaction through exposure to a number, n, of photons. In the photon-mode exposure that takes advantage of photo-chemical interaction of the substances in a photographic material, the energy quantities from the n photons cannot be added up for the reaction because of laws of quantum energy and momentum conservation. In other words, every reaction through photon-mode exposure requires the condition "quantity of energy of one photon $\geq$ quantity of energy for one reaction". On the other hand, in the heat-mode exposure, the light-absorbing substance in a photographic material is first photo-excited to generate heat, and the heat thus having been converted from the light energy serves for the reaction for image formation in a layer of the material. Accordingly, in the heat-mode exposure, the energy quantities of all n photons can be added up for image formation. Therefore, the condition of "energy quantities of n photons $\geq$ energy quantity for one reaction" will be sufficient for the heat-mode exposure. However, the addition of the energy quantities in the heat-mode exposure is restricted by heat diffusion. Specifically, if an exposed area (reaction point) of a photographic material successively undergoes a subsequent photo-excitation and inactivation before heat generated therein by a previous photo-excitation and inactivation step goes out through heat diffusion, and therefore successively receives heat through successive photo-excitations and inactivations, then the heat quantities can be surely accumulated and added up to elevate the temperature of that exposed area. However, if the heat generation in the subsequent step is delayed, the heat generated in the previous step will go out of the area through heat diffusion. In other words, in heat-mode exposure to a predetermined level of total energy, a case of short-time exposure to higher energy and a case of long-time exposure to lower energy produce different results, and the former case of short-time exposure to higher energy is more advantageous than the latter case.

Needless-to-say, the photon-mode exposure may also undergo the same phenomenon as above, being influenced by subsequent reaction diffusion, but is basically free from this phenomenon.

The difference between the photon-mode exposure and the heat-mode exposure will be discussed with respect to the characteristics of a photographic material to be processed. In the photon-mode exposure, intrinsic sensitivity (the quantity of energy necessary for the reaction for image formation) of a photographic material is always constant relative to the exposure power density ($W/cm^2$) (=energy density per unit exposure time); but in the heat-mode exposure, the intrinsic sensitivity increases with an increase in the exposure power density. Now, the exposure time is fixed to suffice for practicable image-recording materials, and the two modes are compared for the thus-fixed exposure time. In photon-mode exposure, in general, a low degree of energy of about 0.1 $mJ/cm^2$ or so may be enough for high-sensitivity exposure of the materials, but even a slight amount of exposure will cause photo-reaction in the materials. Therefore, in this mode, the materials often involve a problem of low-exposure fogging in a non-exposed area. On the other hand, in heat-mode exposure, the photographic materials do not undergo photo-reaction if the amount of exposure is not above a certain level. In this mode, in general, the photographic materials require a level of exposure energy of 50 $mJ/cm^2$ or so, in view of their thermal stability, and are therefore free from the problem of low-exposure fogging in the non-exposed area.

In fact, in heat-mode exposure, photographic materials require an exposure power density of at least 5000 $W/cm^2$ on their surface, preferably at least 10000 $W/cm^2$. Though not described in detail herein, high-power density lasers of higher than $5.0 \times 10^5 W/cm^2$ are undesirable, as they cause ablation and soil light sources and other units.

DESCRIPTION OF THE PREFERRED EMBODIMENTS

The present invention is described in detail hereinunder.
(A) IR absorber having an oxidation potential of at most 0.45 V (vs. SCE):

The IR absorber to be used in the recording material of the present invention has an oxidation potential of at most 0.45 V (vs. SCE), preferably at most 0.40 V (vs. SCE), more preferably at most 0.35 V (vs. SCE).

The lower limit of the oxidation potential of the IR absorber for use in the present invention is not specifically defined. However, in view of stability of the IR absorber combined with a thermal radical generator (B) in the recording material, the oxidation potential of the IR absorber is preferably at least 0.10 V (vs. SCE), more preferably at least 0.15 V (vs. SCE).

For reducing the oxidation potential, the IR absorber used in the present invention has an electron-donating substituent in a chromophoric group therein. Preferably, the electron-donating substituent has a Hammett's σpara value of at most −0.10. Preferred examples of the substituent having a Hammett's σpara value of at most −0.10 are an alkyl group (having a σpara value of from −0.12 to −0.20 or so) such as methyl, ethyl and propyl groups; a hydroxyl group (having a σpara value of −0.37), an alkoxy group (having a σpara value of from −0.24 to −0.45 or so) such as methoxy, ethoxy, propyloxy and butoxy groups; an aryloxy group (having a σpara value of −0.32 or so) such as phenoxy and toluyloxy groups; and a (substituted) amino group (having a σpara value of from −0.50 to −0.35) such as amino, methylamino, ethylamino, butylamino, dimethylamino, diethylamino, phenylamino and diphenylamino groups. Especially preferred are an alkoxy group and a (substituted) amino group of which the electron-donating ability is high.

For expanding a conjugated system of the chromophoric group in the IR absorber to thereby reduce the oxidation potential of the IR absorber, also preferred are substituents having an aromatic group bonded thereto via a hetero atom. The hetero atom that bonds the aromatic group to the substituent includes nitrogen, oxygen, phosphorus, sulfur and selenium atoms. Especially preferred is a sulfur atom. The aromatic group to be bonded to the substituent via such a hetero atom includes an aromatic hydrocarbon group such as a phenyl, naphthyl or anthranyl group; and a heterocyclic group such as furyl, thienyl, pyrazolyl, triazolyl, indolyl and benzothiazolyl groups. Especially preferred are heterocyclic groups. The aromatic groups may have substituents. Preferably, the substituents have a Hammett's σpara value of at most −0.10, such as mentioned hereinabove.

For the chromophoric group in the IR absorber, preferred are polymethine dyes such as cyanine dyes and (thio)pyrylium dyes, in view of absorption wavelength latitude, solubility, stability and potential characteristics. More preferred are cyanine dyes; and even more preferred are heptamethine-cyanine dyes having any of indolenine, benzindolenine, benzothiazole, benzoxazole and benzoselenazole skeletons, in view of absorption wavelength latitude and potential latitude. These polymethine dyes are generally cationic dyes in which the chromophoric group has a positive charge. For reducing the oxidation potential, preferred are betaine-type dyes in which the chromophoric group additionally has a negative charge. Examples of such betaine-type dyes are dyes having a (thio)barbituric acid group substituted on a polymethine chain; and dyes having a squarylium or croconium skeleton inserted into the polymethine chain.

Preferred examples of the dyes having a chromophoric group of the types mentioned above are those of the following general formulae (D1) to (D5).

an alkoxy group having at most 12 carbon atoms, a carboxyl group and a sulfo group. $R^5$, $R^6$, $R^7$ and $R^8$ may be the same or different, and each represents a hydrogen atom or a hydrocarbon group having at most 12 carbon atoms. Preferably, these are all hydrogen atoms, because starting materials for the compound are easily available. $R^9$ and $R^{10}$ may be the same or different, and each represents an optionally-substituted aromatic hydrocarbon group having from 6 to 10 carbon atoms, an alkyl group having from 1 to 8 carbon atoms, or a hydrogen atom; and $R^9$ and $R^{10}$ may be bonded to each other to form any of the following cyclic structures.

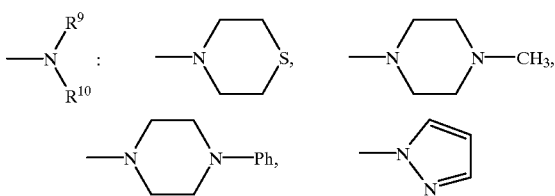

An aromatic hydrocarbon group such as a phenyl group is especially preferred for $R^9$ and $R^{10}$.

$X^-$ represents a counter anion. However, if any of R1 to R8 is substituted with a sulfo group, $X^-$ is unnecessary. Preferably, $X^-$ is a halide ion, a perchlorate ion, a tetrafluoroborate ion, a hexafluorophosphate ion or a sulfonate ion, in view of storage stability of a coating solution of the recording material that will form the recording layer, and more preferably a perchlorate ion, a hexafluorophosphate ion or an arylsulfonate ion.

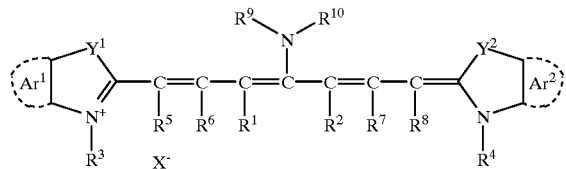

(D1)

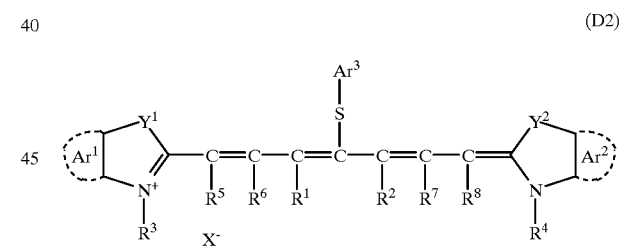

(D2)

In formula (D1), $R^1$ and $R^2$ each independently represents a hydrogen atom or a hydrocarbon group having from 1 to 12 carbon atoms; and $R^1$ and $R^2$ may be bonded to each other to form a ring structure. The ring to be formed is preferably a 5-membered or 6-membered ring. $Ar^1$ and $Ar^2$ may be the same or different, and each represents an optionally-substituted aromatic hydrocarbon group. For this aromatic hydrocarbon group for them, preferred are benzene and naphthalene rings. Preferred substituents are a hydrocarbon group having at most 12 carbon atoms, a halogen atom, and an alkoxy group having at most 12 carbon atoms. $Y^1$ and $Y^2$ may be the same or different, and each represents a sulfur atom or a dialkylmethylene group having at most 12 carbon atoms. $R^3$ and $R^4$ may be the same or different, and each represents an optionally-substituted hydrocarbon group having at most 20 carbon atoms. Preferred substituents are In formula (D2), $R^1$ to $R^8$, $Ar^1$, $Ar^2$, $Y^1$, $Y^2$ and $X^-$ have the same meanings as in formula (D1). $Ar^3$ represents a mono- or poly-heterocyclic group having at least one atom of nitrogen, oxygen or sulfur and is preferably a heterocyclic group selected from the group consisting of thiazoles, benzothiazoles, naphthothiazoles, thianaphtheno-7',6',4,5-thiazoles, oxazoles, benzoxazoles, naphthoxazoles, selenazoles, benzoselenazoles, naphthoselenazoles, thiazolines, 2-quinolines, 4-quinolines, 1-isoquinolines, 3-isoquinolines, benzoimidazoles, 3,3-dialkylbenzindolenines, 2-pyridines, 4-pyridines, 3,3-dialkylbenz[e]indoles, tetrazoles, triazoles, pyrimidines and thiadiazoles. Especially preferred heterocyclic groups for $Ar^3$ are mentioned below.

Ar³:

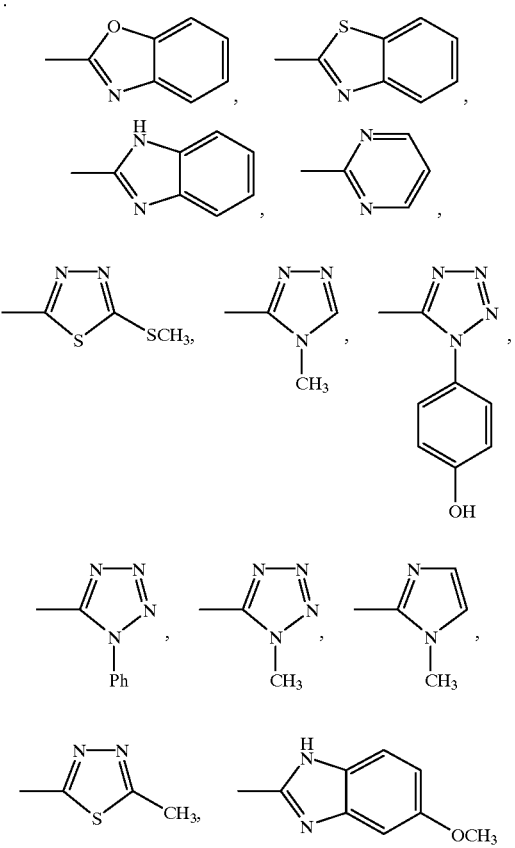

(D3)

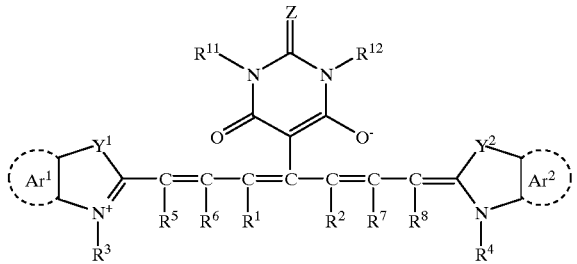

In formula (D3), $R^1$ to $R^8$, $Ar^1$, $Ar^2$, $Y^1$ and $Y^2$ have the same meanings as in formula (D1). $R^{11}$ and $R^{12}$ may be the same or different, and each represents a hydrogen atom, an allyl group, a cyclohexyl group, or an alkyl group having from 1 to 8 carbon atoms. Z represents an oxygen or sulfur atom.

(D4)

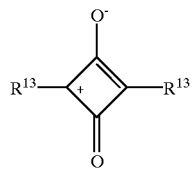

In formula (D4), $R^{13}$ represents a substituent having any of the following structures, in which $R^{14}$ and $R^{15}$ each are an alkyl group having from 1 to 8 carbon atoms, and $Y_3$ is an oxygen or sulfur atom.

$R^{13}$:

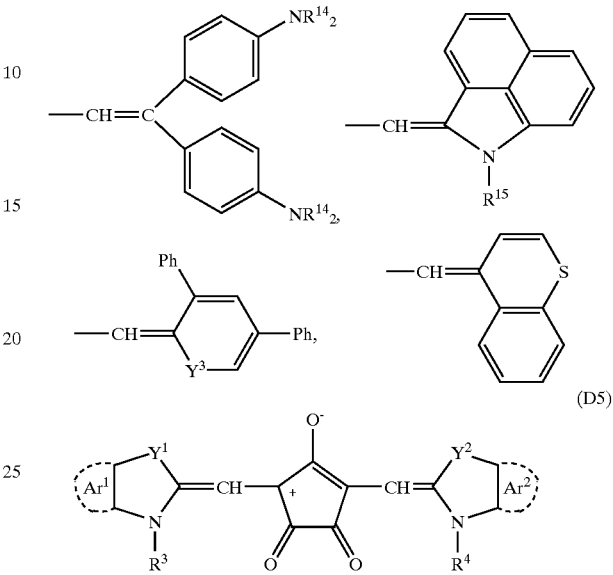

(D5)

In formula (D5), $R^1$ to $R^8$, $Ar^1$, $Ar^2$, $Y^1$ and $Y^2$ have the same meanings as in formula (D1).

Of the chromophoric group-having dyes mentioned above, more preferred are those of formulae (D1) to (D3); and even more preferred are those of formula (D1).

The oxidation potential of the IR absorber for use in the present invention is in terms of a value vs. SCE (saturated calomel electrode), measured in a polar solvent such as acetonitrile or methanol through potentiometry, for which an indicator electrode is a hydrogen electrode, a glass electrode or a quinhydrone electrode, and a reference electrode is a saturated calomel electrode or a silver/silver chloride electrode.

Specific examples ([IR-1] to [IR-12]) of IR absorbers having an oxidation potential of at most 0.35 V (vs. SCE) and preferred for use in the present invention are mentioned below along with their oxidation potential, to which, however, the present invention is not limited. The condition in measuring the oxidation potential of the IR absorbers is as follows: Each IR absorber is measured in a polar solvent (0.1 M Et4NClO4/MeCN), using a rotary disc electrode of Pt as the indicator electrode and an Ag/AgCl (silver/silver chloride) electrode as the reference electrode. The value obtained is converted into a value versus the reference electrode, the saturated calomel electrode (vs. SCE).

| IR Absorber | Structure | Oxidation Potential (V vs. SCE) |
|---|---|---|
| IR-1 | | 0.20 |
| IR-2 | | 0.22 |
| IR-3 | | 0.24 |
| IR-4 | | 0.27 |
| IR-5 | | 0.27 |
| IR-6 | | 0.30 |

-continued

| IR Absorber | Structure | Oxidation Potential (V vs. SCE) |
|---|---|---|
| IR-7 | | 0.30 |
| IR-8 | | 0.35 |
| IR-9 | | 0.35 |
| IR-10 | | 0.35 |
| IR-11 | | 0.40 |

-continued

| IR Absorber | Structure | Oxidation Potential (V vs. SCE) |
|---|---|---|
| IR-12 | 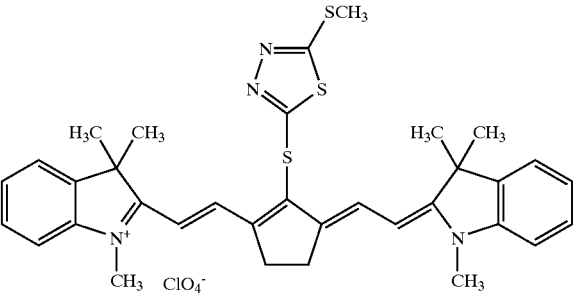 | 0.44 |

Compared with those having a high oxidation potential, IR absorbers having a low oxidation potential ensure significantly improved hardenability of recording layers, as mentioned hereinabove. Though not clear, one reason may be that the combination of the IR absorber having a low oxidation potential and an ionic radical generator in a recording layer may promote decomposition of the radical generator therein and thereby promote polymerization of a radical-polymerizing compound in the layer, and, as a result, the mechanical strength of the image area of the layer will be increased after promoted polymerization.

One or more of the above-mentioned IR absorbers may be in the image-recording material of the present invention.

Provided the advantages of the present invention are not disrupted, the recording material may also contain any other ordinary IR absorber having an oxidation potential higher than 0.45 V (vs. SCE) along with the IR absorber having the low oxidation potential. In this case, however, the amount of the ordinary IR absorber that may be in the recording material is preferably at most 40% by weight of the total solid content of all IR absorbers therein.

For the ordinary IR absorber that may be in the recording material, mentioned are ordinary dyes and pigments such as those described in JP-A No. 7-285275 and 10-268512.

In the image-recording material of the present invention, the IR absorber is preferably in an amount of from 0.01 to 50% by weight, more preferably from 0.1 to 20% by weight, even more preferably from 1 to 10% by weight of the total solid content of the material. If the amount of the IR absorber in the material is smaller than 0.01% by weight, the sensitivity of the material will be low; but if larger than 50% by weight, a non-image area of a printing plate having a layer of the material will be stained.

Also, preferably, the optical density of the recording material that contains the IR absorber is from 0.05 to 3.0 at an absorption peak in the IR range. If the optical density oversteps the range, the sensitivity of the recording material will be low. The optical density is determined based on the amount of the IR absorber in the recording material and the thickness of the recording layer of the material. Therefore, the desired optical density may be attained by controlling these two conditions. The optical density of the recording layer may be measured in any ordinary manner. For example, the recording material of which the optical density is to be measured is applied to a transparent or white support to form thereon a recording layer whose dry thickness is within the range necessary for lithographic printing plates, and the transmittance of the recording layer is measured with a transmittance meter; or the material is applied to a reflective support of, for example, aluminum to form thereon a recording layer, and the reflection density of the layer is measured.

The IR absorber may be added to the same photosensitive layer of the material as other components; or may be in a separate layer, which may be applied with a layer containing the other components.

(B) Thermal Radical Generator

The thermal radical generator (B) is a compound that generates a radical after receiving thermal energy, and initiates and promotes the polymerization of polymerizing unsaturated group-having compounds. It may be any known thermal polymerization initiator or any known compound requiring a small association-dissociation energy. Examples include onium salts, trihalomethyl group-having triazine compounds, peroxides, azo-type polymerization initiators, azide compounds, quinonediazide compounds, and metallocene compounds. Preferred are onium salts, mentioned below, due to having high sensitivity.

Preferred onium salts for use in the present invention are diazonium salts, iodonium salts, sulfonium salts, ammonium salts, and pyridinium salts. Of those, more preferred are iodonium salts, diazonium salts and sulfonium salts. The onium salt is not an acid generators, but functions as an ionic radical polymerization initiator. Preferred onium salts for use herein are those of the following general formulae (III) to (V):

General formula (III)

General formula (IV)

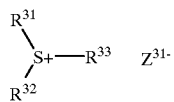

General formula (V)

In formula (III), $Ar^{11}$ and $Ar^{12}$ each independently represents an optionally-substituted aryl group having at most 20 carbon atoms. Preferred examples of substituents for the substituted aryl group are a halogen atom, a nitro group, an alkyl group having at most 12 carbon atoms, an alkoxy group having at most 12 carbon atoms, and an aryloxy group having at most 12 carbon atoms. $Z^{11-}$ represents a paired ion selected from halide ions, perchlorate ions, tetrafluoroborate ions, hexafluorophosphate ions and sulfonate ions, and is preferably any of perchlorate ions, hexafluorophosphate ions and arylsulfonate ions.

In formula (IV), $Ar^{21}$ represents an optionally-substituted aryl group having at most 20 carbon atoms. Preferred substituents are a halogen atom, a nitro group, an alkyl group having at most 12 carbon atoms, an alkoxy group having at most 12 carbon atoms, an aryloxy group having at most 12 carbon atoms, an alkylamino group having at most 12 carbon atoms, a dialkylamino group having at most 12 carbon atoms, an arylamino group having at most 12 carbon atoms, and a diarylamino group having at most 12 carbon atoms. $Z^{21-}$ has the same meaning as $Z^{11-}$, representing a paired ion.

In formula (V), $R^{31}$, $R^{32}$ and $R^{33}$ may be the same or different, and each represents an optionally-substituted hydrocarbon group having at most 20 carbon atoms. Preferred substituents are a halogen atom, a nitro group, an alkyl group having at most 12 carbon atoms, an alkoxy group having at most 12 carbon atoms, and an aryloxy group having at most 12 carbon atoms. $Z^{31-}$ has the same meaning as $Z^{11-}$, representing a paired ion.

Hereinunder shown are specific examples of the preferred onium salts for use in the present invention, those of formula (III), [OI-1] to [OI-10], those of formula (IV), [ON-1] to [ON-5], and those of formula (V), [OS-1] to [OS-6].

[OI-1]
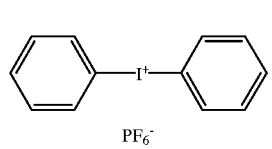

[OI-2]
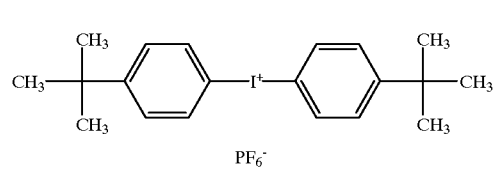

[OI-3]
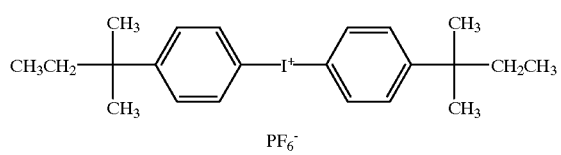

[OI-4]
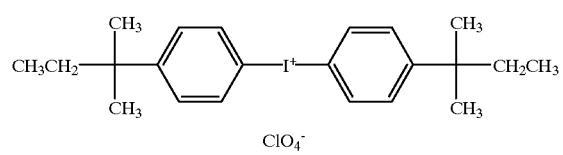

[OI-5]
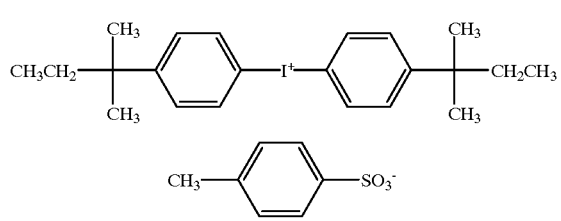

[OI-6]
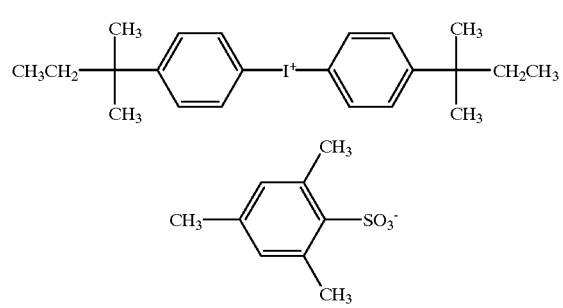

[OI-7]
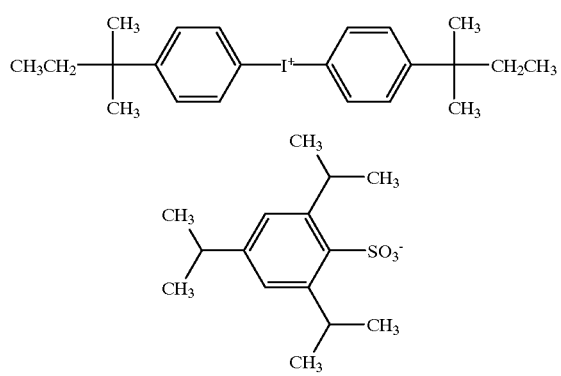

[OI-8]
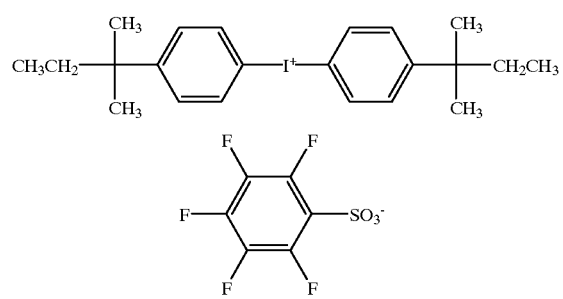

[OI-9]
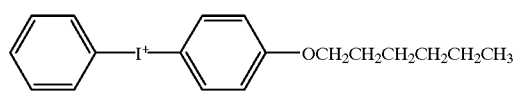

[OI-10]
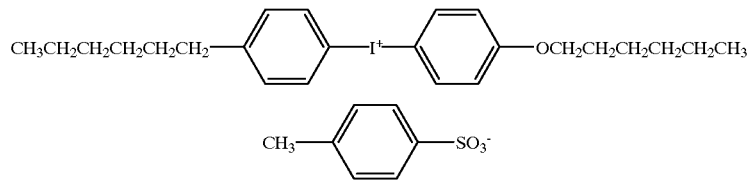
[ON-1]
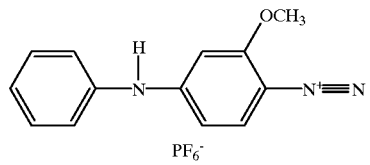
[ON-2]
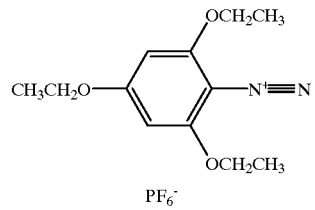
[ON-3]
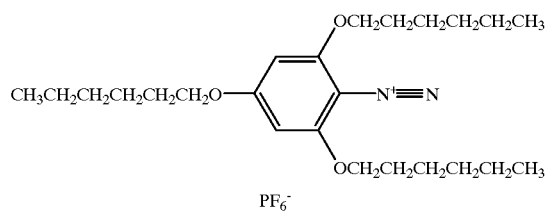
[ON-4]
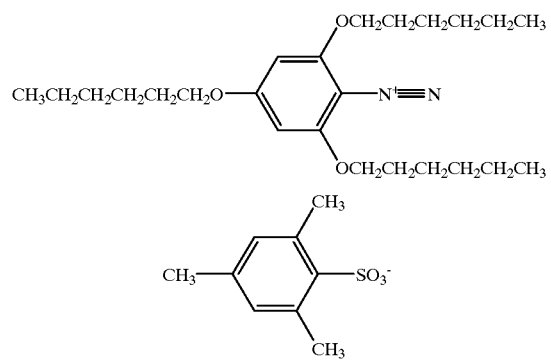
[ON-5]
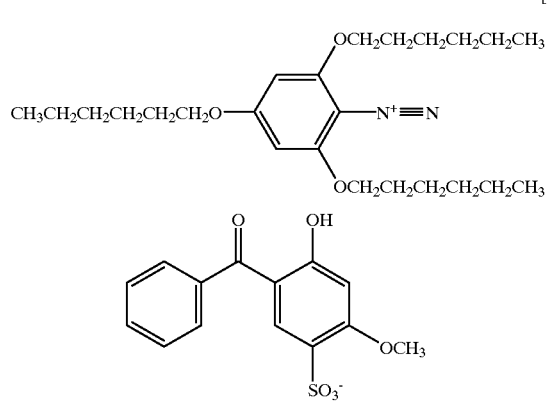
[OS-1]
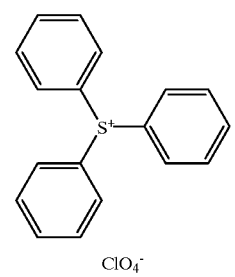
[OS-2] [OS-3]
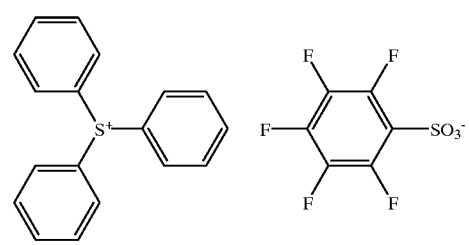

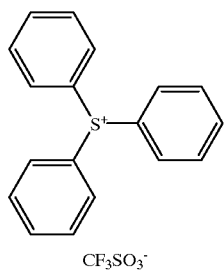

[OS-4]

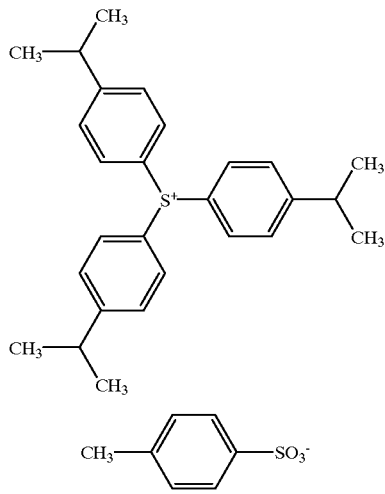

[OS-5]

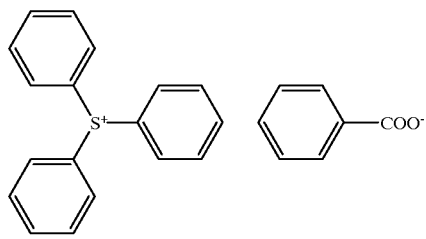

[OS-6]

Preferably, the onium salts for use in the present invention have a peak absorption wavelength of not longer than 400 nm, more preferably not longer than 360 nm. As the onium salt has the absorption wavelength in the UV range, the image-recording material of the present invention can be handled and processed even under white light.

The onium salt may be in the image-recording material in an amount of from 0.1 to 50% by weight, preferably from 0.5 to 30% by weight, more preferably from 1 to 20% by weight of the total solid content of the material. If the amount of the onium salt therein is smaller than 0.1% by weight, the sensitivity of the recording material will be low; but if larger than 50% by weight, the non-image area of the printing plates having a layer of the material will be stained. One or more such onium salts may be in the recording material either singly or combined. If desired, the onium salt may be added to the same photosensitive layer of the material as the other components; or may be in a separate layer, which may be combined with a layer containing the other components.

(C) Radical-Polymerizing Compound

The radical-polymerizing compound in the image-recording material of the present invention has at least one ethylenically unsaturated double bond, and is selected from compounds having at least one, preferably at least two terminal ethylenically unsaturated bonds. These compounds are well known in the art, and any of them are usable herein with no specific limitation. They have various chemical forms, including, for example, monomers, prepolymers (e.g., dimers, trimers and oligomers), and mixtures and copolymers thereof and the like. Examples of monomers and copolymers thereof are unsaturated carboxylic acids (e.g., acrylic acid, methacrylic acid, itaconic acid, crotonic acid, isocrotonic acid, maleic acid and the like), and esters and amides thereof. Preferred are esters of unsaturated carboxylic acids and aliphatic polyalcohols; and amides of unsaturated carboxylic acids and aliphatic polyamines. Also preferred are adducts of unsaturated carboxylates or amides having a nucleophilic substituent of, for example, a hydroxyl, amino or mercapto group, with monofunctional or polyfunctional isocyanates or epoxides; and dehydrated condensates thereof with monofunctional or polyfunctional carboxylic acids. Also preferred are adducts of unsaturated carboxylates or amides having an electrophilic substituent of, for example, an isocyanate or epoxy group, with monofunctional or polyfunctional alcohols, amines or thiols; and substituting reaction products of unsaturated carboxylates or amides having a leaving substituent of, for example, a halogen or a tosyloxy group, with monofunctional or polyfunctional alcohols, amines or thiols. Also usable herein are other groups of compounds, for which unsaturated phosphonic acids or styrenes are used in place of the unsaturated carboxylic acids.

Specific examples of esters of aliphatic polyalcohols and unsaturated carboxylic acids for use as the radical-polymerizing compound are mentioned below. Acrylates include ethylene glycol diaclylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomers and the like.

Methacrylates include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis-[p-(methacryloxyethoxy)phenyl]dimethylmethane and the like.

Itaconates include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate and the like.

Crotonates include ethylene glycol dicrotonate, tetramethylene glycol dicrotonate, pentaerythritol dicrotonate, sorbitol tetracrotonate and the like.

Isocrotonates include ethylene glycol diisocrotonate, pentaerythritol diisocrotonate, sorbitol tetraisocrotonate and the like.

Maleates include ethylene glycol dimaleate, triethylene glycol dimaleate, pentaerythritol dimaleate, sorbitol tetramaleate and the like.

Other esters also preferred for use herein are, for example, aliphatic alcohol esters such as those described in JP-B Nos. 46-27926 and 51-47334, and JP-A No. 57-196231; aromatic esters as in JP-A Nos. 59-5240, 59-5241 and 2-226149; and amino-having esters as in JP-A No. 1-165613.

Specific examples of amide monomers of aliphatic polyamines and unsaturated carboxylic acids preferred for use herein are methylenebis-acrylamide, methylenebis-methacrylamide, 1,6-hexamethylenebis-acrylamide, 1,6-hexamethylenebis-methacrylamide, diethylenetriamine-trisacrylamide, xylylenebis-acrylamide, xylylenebis-methacrylamide and the like.

Other amide monomers also preferred for use herein are those having a cyclohexylene structure, as in JP-B No. 54-21726.

Also preferred are urethane polyadducts obtained through addition reaction of isocyanates with hydroxyl compounds. Specific examples are vinylurethanes having at least two polymerizing vinyl groups in one molecule, which are produced through addition reaction of polyisocyanate compounds having at least two isocyanate groups in one molecule with hydroxyl-having vinyl monomers of the following formula (VI) and the like, for example, as in JP-B No. 48-41708.

$$CH_2=C(R^{41})COOCH_2CH(R^{42})OH \qquad \text{General formula (VI)}$$

wherein $R^{41}$ and $R^{42}$ each represents H or CH3.

Also preferred for use herein are urethane acrylates such as those described in JP-A No. 51-37193, and JP-B Nos. 2-32293 and 2-16765; and ethylene oxide skeleton-having urethane compounds as in JP-B Nos. 58-49860, 56-17654, 62-39417 and 62-39418.

Also usable herein are radical-polymerizing compounds having an amino structure or sulfido structure in the molecule, such as those described in JP-A Nos. 63-277653, 63-260909 and 1-105238.

Other examples usable herein are polyfunctional acrylates and methacrylates such as polyester acrylates, and epoxy acrylates produced through reaction of epoxy resins with (meth)acrylic acids, for example, as in JP-A No. 48-64183, and JP-B Nos. 49-43191 and 52-30490. Also usable are specific unsaturated compounds, as in JP-B Nos. 46-43946, 1-40337 and 1-40336; and vinylphosphonic acids, as in JP-A No. 2-25493. As the case may be, preferred are perfluoroalkyl-having compounds such as those described in JP-A No. 61-22048. Also usable herein are photo-curable monomers and oligomers disclosed in *Journal of the Adhesive Association of Japan*, Vol. 20, No. 7. pp. 300–308 (1984).

Details of the use of these radical-polymerizing compounds in the present invention, including what type of compound is used, whether the compounds are used singly or combined, and how much of the compound is added to the recording material, may be freely determined in accordance with the performance requirements of the ultimate recording material of the present invention. For example, the compounds may be selected in view of the following points. With respect to the sensitivity of the recording material, preferred are radical-polymerizing compounds having more unsaturated groups in one molecule. In many cases, preferred are polyfunctional compounds that are at least difunctional. On the other hand, in order to increase the mechanical strength of the image area, that is, the mechanical strength of the cured film of the material, preferred are polyfunctional compounds that are at least trifunctional. Combining various radical-polymerizing compounds that differ in the number of functional groups therein and in the type of polymerizing groups therein (for example, acrylates, methacrylates, styrenes and the like) is effective for enhancing both the sensitivity of the recording material and the mechanical strength of the image area of the film of the material. Compounds having a large molecular weight and compounds having a high degree of hydrophobicity ensure high sensitivity and high film strength, but are often undesirable as they might not be well processed at high development speed and as they often deposit in developers. Selection and use of radical-polymerizing compounds in the present invention is a matter of great importance in view of their compatibility and dispersibility with the other components of the photosensitive layer of the recording material of the present invention (e.g., binder polymers, polymerization initiators and colorants). For example, using low-purity compounds or combining two or more different compounds may improve the compatibility of the compounds with the other components. As the case may be, compounds having a specific structure can be selected for improving adhesiveness of the recording material to a support or overcoat layer. In general, the blend ratio of the radical-polymerizing compound in the recording layer of the image-recording material is preferably larger for higher sensitivity of the image-recording layer. However, if the blend ratio is too large, there may be problems in that unfavorable phase separation may occur in the coating liquid of the material, the image-recording layer of the material may be sticky and interfere with smooth production of products (for example, the components of the recording layer are transferred and adhere to unintended areas), and deposits may be formed in a developer solution. In view of these points, the preferred blend ratio of the radical-polymerizing material in the recording material of the present invention is generally from 5 to 80% by weight, more preferably between 20 and 75% by weight of all the components of the material. One or more different radical-polymerizing compounds may be in the material either singly or combined. Regarding a method of using the radical-polymerizing compounds in the material, the structure, the blend ratio and the amount of the compounds to be in the material may be suitably selected depending on a degree of polymerization retardation of the compounds by oxygen, resolution of the recording layer containing the compound, fogging resistance, a refractive index change, surface adhesiveness and the like. As the case may be, subbing layers or over-coat layers may be disposed on or below the recording layer in any desired manner.

(D) Binder Polymer

The image-recording material of the present invention may contain a binder polymer for improving film characteristics of the recording layer of the material. For the binder, preferred are linear organic polymers. The linear organic polymers may be any known ones. Preferred are those soluble or swellable in water or weak alkaline water, for enabling development of the material with water or weak alkaline water. The linear organic polymers serving as a film-forming agent in the image-recording material may be selectively used, depending on the mode of development of the material with any of water, weak alkaline water or solvent developers. For example, when a water-soluble organic polymer is used, the recording material can be developed with water. The linear organic polymers may be radical polymers having a carboxylic acid group in the side branches, such as those described in JP-A No. 59-44615, JP-B Nos. 54-34327, 58-12577 and 54-25957, and JP-A Nos. 54-92723, 59-53836 and 59-71048. These include, for example, methacrylic acid copolymers, acrylic acid copolymers, itaconic acid copolymers, crotonic acid copolymers, maleic acid copolymers, and partial esters of maleic acid copolymers. In addition to these, also usable herein are acid cellulose derivatives having a carboxylic acid group in the side branches, as well as hydroxyl-having polymer adducts with cyclic acid anhydrides.

Of these, especially preferred are (meth)acrylic resins having both a benzyl or allyl group and a carboxyl group in the side branches, due to ensuring good balance of the film strength, the sensitivity and the developability of the image-recording material.

Also preferred are urethane-type binder polymers having an acid group, such as those described in JP-B Nos. 7-12004, 7-120041, 7-120042 and 8-12424, JP-A Nos. 63-287944, 63-287947 and 1-271741, and Japanese Patent Application No. 10-116232, due to ensuring extremely high strength of the image-recording layer of the material, and therefore ensuring good printing durability of the processed material and good low-exposure latitude in processing the material.

In addition, polyvinyl pyrrolidone, ethylene oxide and the like are also preferred for water-soluble linear organic polymers for use herein. Also preferred are alcohol-soluble nylons and polyethers of 2,2-bis(4-hydroxyphenyl)propane and epichlorohydrin, for increasing the mechanical strength of the cured film of the recording material.

Preferably, the polymer used in the present invention has a weight-average molecular weight of at least 5,000, more preferably from 10,000 to 300,000, and a number-average molecular weight of at least 1,000, more preferably from 2,000 to 250,000. Also, the polymer preferably has a molecular weight distribution (weight-average molecular weight/number-average molecular weight) of at least 1, more preferably from 1.1 to 10.

The polymer may be any of random polymers, block polymers or graft polymers, but is preferably a random polymer.

The polymer for use in the present invention may be synthesized by any known method. Solvents usable in synthesis include, for example, tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, and water. One or more of these solvents may be used either singly or as combined.

A radical polymerization initiator usable for synthesizing the polymer may be any known compound, including, for example, azo-type initiators, and peroxide initiators.

In producing the image-recording material of the present invention, one or more binder polymers may be added thereto either singly or combined. Preferably, the amount of the polymer to be added to the material falls between 20 and 95% by weight, more preferably between 30 and 90% by weight of the total solid content of the material. If the amount is smaller than 20% by weight, the polymer added will be ineffective for increasing the mechanical strength of the image area of the film of the processed material; but if larger than 95% by weight, no image is formed on the material. Also preferably, the ratio of the linear organic polymer to the radical-polymerizable ethylenically unsaturated double bond-having compound in the recording material falls between 1/9 and 7/3 by weight.

Other Components

In addition to the components mentioned above, various compounds may be optionally added to the image-recording material of the present invention. For example, dyes having a great absorption in the visible light range may be added thereto, serving as colorants for images. Specifically, the dyes are Oil Yellow #101, Oil Yellow # 103, Oil Pink #312, Oil Green BG, Oil Blue BOS, Oil Blue #603, Oil Black BY, Oil Black BS, Oil Black T-505 (these are products of Orient Chemical); Victoria Pure Blue, Crystal Violet (CI 42555), Methyl Violet (CI 42535), Ethyl Violet, Rhodamine B (CI 145170B), Malachite Green (CI 42000), Methylene Blue (CI 52015), dyes described in JP-A No. 62-293247, and the like. Pigments such as phthalocyanine pigments, azo pigments, carbon black and titanium oxide are also preferred as colorants for the recording material.

Adding the colorant to the image-recording material is preferred, due to facilitating differentiation of the image area from the non-image area in the layer of the processed material. The amount of the colorant in the material may fall between 0.01 and 10% by weight of the total solid content of the material.

Preferably, a small amount of a thermal polymerization inhibitor is added to the image-recording material for preventing unnecessary thermal polymerization of the radical-polymerizable, ethylenically unsaturated double bond-having compound in the material while the material is being produced or stored. Examples of the thermal polymerization inhibitor are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitroso-N-phenylhydroxylamine aluminum salt and the like. Preferably, the amount of the thermal polymerization inhibitor in the material falls between about 0.01% by weight and about 5% by weight of the material. If desired, a higher fatty acid or derivative thereof, such as behenic acid or behenic acid amide, having the ability to prevent polymerization retardation by oxygen may be added to the recording material. In a step of drying the material after coating on a support, the acid or acid derivative added to the material may be localized in the surface of the photosensitive layer of the material formed on the support. Preferably, the amount of the higher fatty acid or derivative in the recording material falls between about 0.1% by weight and about 10% by weight of the material.

Also, the image-recording material of the present invention may contain a nonionic surfactant, as in JP-A Nos. 62-251740 and 3-208514, or an ampholytic surfactant as in JP-A Nos. 59-121044 and 4-13149, for further ensuring stable development of the material in various conditions.

Specific examples of the nonionic surfactant are sorbitan tristearate, sorbitan monopalmitate, sorbitan trioleate, stearic acid monoglyceride, polyoxyethylene nonylphenyl ether and the like.

Specific examples of the ampholytic surfactant are alkyl-di(aminoethyl)glycines, alkyl-polyaminoethylglycine hydrochlorides, 2-alkyl-N-carboxyethyl-N-hydroxyethylimidazolium betaines, N-tetradecyl-N,N-betaines (e.g., AMOGEN K manufactured by Dai-ichi Kogyo) and the like.

The amount of the nonionic surfactant or ampholytic surfactant in the image-recording material preferably falls between 0.05 and 15% by weight, more preferably between 0.1 and 5% by weight of the material.

Also, if desired, the image-recording material of the present invention may contain a plasticizer for softening the film of the material. The plasticizer includes, for example, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate or the like.

In general, the above-mentioned components of the image-recording material of the present invention are dissolved in a solvent and applied to a suitable support. The solvent includes, for example, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene, water or the like, but is not limited thereto. These solvents may be used singly or combined. Preferably, the concentration of the constituent components (in terms of total solid content including additives) in the solvent falls between 1 and 50% by weight.

The amount (in terms of solid content of the material) of the layer formed and dried on the support varies depending on the use of the material, but in general is preferably between 0.5 and 5.0 g/m$^2$ for lithographic printing plates. For applying the coating liquid of the material to supports, various coating methods can be employed. For example, employable are any of bar coating, spin coating, spraying, curtain coating, dipping, air-knife coating, blade coating, and roll coating. With a decrease in the amount of the material coated, the apparent sensitivity of the image-recording layer formed increases, but the film characteristics of the layer decrease.

For improving the coatability of the image-recording material of the present invention, a surfactant, for example, a fluorine-containing surfactant as in JP-A No. 62-170950 may be added to the material. Preferably, the amount of the surfactant to be added falls between 0.01 and 1% by weight, and more preferably between 0.05 and 0.5% by weight of the total content of the material.

Protective Layer

On the image-recording layer of the material of the present invention that contains a photo-polymerizing compound, optionally formed is a protective layer. The image-recording layer is generally exposed to light in air. The protective layer formed on the photosensitive recording layer acts to prevent low-molecular compounds such as oxygen and basic substances entering the photosensitive recording layer (these low-molecular compounds are present in air and retard image-formation in the photosensitive recording layer exposed to light in air), and thereby protects the photosensitive recording layer from such low-molecular compounds. Accordingly, the necessary characteristic of the protective layer is that oxygen and other low-molecular compounds do not permeate through the layer. In addition, it is desirable that light transmission through the layer is high, adhesiveness of the layer to the underlying photosensitive recording layer is good, and the protective layer is readily removed through development after exposure.

Various protective layers have heretofore been suggested, for example, as described in detail in U.S. Pat. No. 3,458,311 and JP-A No. 55-49729. For a material for the protective layer preferred is, for example, a water-soluble polymer compound having a relatively high degree of crystallinity. Specifically known are water-soluble polymers such as polyvinyl alcohol, polyvinyl pyrrolidone, acetic cellulose, gelatin, gum arabic, and polyacrylic acid. Of those, polyvinyl alcohol is preferred as a main component of the protective layer, due to providing the best results for basic characteristics of a layer that blocks out oxygen and is readily removable through development. Polyvinyl alcohol for the protective layer may be partially esterified, etherified and/or acetallized as long as it has unsubstituted vinyl alcohol units, which are necessary for its oxygen barrier property and for its solubility in water. Also, if desired, a part thereof may have another copolymer component.

For example, polyvinyl alcohol hydrolyzed to a degree of from 71 to 100% and having a molecular weight of from 300 to 2,400 may be used for the protective layer. Specific examples of polyvinyl alcohol of this type are Kuraray's PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 and the like.

The constituent components of the protective layer (e.g., the type of PVA to be used, the presence or absence of additives in the layer), and the amount forming the layer should be determined in consideration of the oxygen barrier property of the layer, the removability of the layer through development, and also fogging resistance, adhesiveness and scratch resistance of the layer. In general, it is desirable that PVA hydrolyzed to a higher degree (PVA in which unsubstituted vinyl alcohol units are higher in number) is used to form a thicker protective layer, as the oxygen barrier property of the layer will be better and the sensitivity will be higher. However, it is often problematic if the ability of the protective layer to block out oxygen is enhanced too much, in that some unnecessary polymerization will occur in the photosensitive recording layer while photographic materials comprising the layer are produced or are stored before processing, and that, when imagewise exposed, the layer will be undesirably fogged or an image line formed in exposure will be thickened. In addition, the adhesiveness of the protective layer to the image area of the processed photosensitive layer and the scratch resistance of the protective layer are also extremely important in handling the printing plates. Specifically, when a hydrophilic layer of a water-soluble polymer (the protective layer of this case) is laminated over an oleophilic polymerizing layer (the photosensitive recording layer), the hydrophilic polymer layer tends to peel off from the oleophilic polymerizing layer as adhesiveness between the two is low. In this case, the part of the oleophilic polymerizing layer (photosensitive recording layer) from which the hydrophilic polymer layer (protective layer) has been peeled will not be well polymerized owing to oxygen penetration thereinto, and will therefore involve a defect of curing failure.

To solve this problem, that is, to improve the adhesiveness between the two layers, various proposals have heretofore been made. For example, in U.S. Pat. No. 4,072,527, from 20 to 60% by weight of an acrylic emulsion or a water-insoluble vinyl pyrrolidone-vinyl acetate copolymer is added to a hydrophilic polymer essentially of polyvinyl alcohol, and a layer of the resulting mixture is laminated over a polymerizing layer to ensure good adhesiveness between the two layers. Any known technique such as that disclosed in these U.S. patent specifications may apply to the protective layer in the present invention. The method of forming the protective layer in such a known manner is described in detail in, for example, U.S. Pat. No. 3,458,311 and JP-A No. 55-49729.

Further, the protective layer may be modified to provide additional functions. For example, a colorant (e.g., a water-soluble dye) capable of transmitting light for exposure (for example, IR radiation in a wavelength range of about from 760 to 1200 nm for the image-recording material of the present invention) and capable of efficiently absorbing other light, which does not participate in exposure, may be added to the protective layer to thereby further broaden safe light latitude of the photographic material having the protective layer, while not lowering.

Support

One example of a support to which the image-recording material of the present invention may be applied is a tabular support having good dimensional stability, for example, paper, paper laminated with a plastic material (e.g., polyethylene, polypropylene or polystyrene), metal sheets (of, for example, aluminum zinc or copper), plastic films (of, for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinyl acetal), or paper or plastic films coated with metal, such as the metals mentioned above, through lamination or deposition.

As the support of the image-forming material of the present invention, preferred are polyester films and aluminum sheets. Above all, especially preferred are aluminum sheets, due to having good dimensional stability and being relatively inexpensive. Preferably, the aluminum sheet is a pure aluminum sheet or an aluminum alloy consisting mainly of aluminum and containing traces of hetero elements. aluminum-laminated or deposited plastic films are also usable herein. The hetero elements in the aluminum alloy include, for example, silicon, iron, manganese, copper, magnesium, chromium, zinc, bismuth, nickel and titanium. The hetero element content of the aluminum alloy is at most 10% by weight. Especially preferred for use in the present invention are pure aluminum sheets. However, completely pure aluminum is difficult to prepare with an ordinary smelting technique. Therefore, the pure aluminum for use herein may contain traces of hetero elements. The aluminum sheets for use in the present invention are not specifically defined with regard to composition, and any known aluminum sheets which have heretofore been used in the art may be used in the present invention. The thickness of the aluminum sheet may be from 0.1 mm to 0.6 mm or so, preferably between 0.15 mm and 0.4 mm, and more preferably between 0.2 mm and 0.3 mm.

Prior to roughening, if desired, the surface of the aluminium sheet may be degreased, for example, by treatment with a surfactant, an organic solvent or an aqueous alkali solution, for removing rolling oil.

The surface of the aluminum sheet may be roughened by various methods. For example, it may be mechanically roughened, or may be roughened through electrochemical surface dissolution or through selective chemical dissolution. For mechanical roughening, any known method is employable. For example, the surface of the aluminum sheet may be roughened by ball grinding, brushing, blasting, or buffing. For electrochemical roughening, for example, the aluminum sheet may be processed in an electrolytic solution of hydrochloric acid or nitric acid with a direct current or an alternating current being applied. These two methods may be combined, as in JP-A No. 54-63902.

If desired, the thus-roughened aluminum sheet may be etched with alkali and neutralized, and then optionally subjected to anodic oxidation for further enhancing water retentiveness and abrasion resistance of the surface. For anodic oxidation of the aluminum sheet, employable are various types of electrolytes capable of forming porous oxide films. Generally employed is sulfuric acid, phosphoric acid, oxalic acid, chromic acid or a mixture thereof. The concentration of the electrolyte for anoxic oxidation may be determined depending on the type of the electrolyte used.

The conditions for anodic oxidation vary, depending on the type of the electrolyte used, and therefore cannot be specified for all cases. In general, however, electrolyte concentration of the processing solution may be between 1 and 80% by weight; temperature of the processing solution may be between 5 and 70° C.; current density may be between 5 and 60 A/dm$^2$; voltage may be between 1 and 100 V; and the time for electrolysis may be between 10 seconds and 5 minutes.

The amount of the oxide film to be formed through such anodic oxidation is preferably at least 1.0 g/m$^2$. If the amount is less, desired printing durability will be unsatisfactory, and the non-image area of the lithographic printing plate will be readily scratched. After scratching, ink will adhere to the scratches and obtained prints will often be stained.

After having been subjected to anodic oxidation, the surface of the aluminum sheet is optionally hydrophilicated. For hydrophilication, employable is, for example, a method of processing the aluminum sheet with an alkali metal silicate (e.g., aqueous sodium silicate solution), as in U.S. Pat. No. 2,714,066, 3,181,461, 3,280,734 and 3,902,734. In this method, the support is dipped in an aqueous sodium silicate solution or is electrolyzed in the solution. Apart from this method, also employable is a method of processing the aluminum sheet with potassium fluorozirconate, as in JP-B No. 36-22063; or a method of processing with polyvinylphosphonic acid, as in U.S. Pat. No. 3,276,868, 4,153, 461 and 4,689,272.

The image-recording material of the present invention may be applied to a support such as that mentioned hereinabove, to form thereon a recording layer of the material. If desired, a subbing layer may be provided between the recording layer and the support.

Various organic compounds can be used as components of the subbing layer. For example, carboxymethyl cellulose, dextrin, gum arabic; amino group-having phosphonic acids such as 2-aminoethylphosphonic acid; other organic phosphonic acids such as optionally-substituted phenylphosphonic acids, naphthylphosphonic acids, alkylphosphonic acids, glycerophosphonic acids, methylenediphosphonic acids and ethylenediphosphonic acids; organic phosphoric acids such as optionally-substituted phenylphosphoric acid, naphthylphosphoric acid, alkylphosphoric acid and glycerophosphoric acid; organic phosphinic acids such as optionally-substituted phenylphosphinic acid, naphthylphosphinic acid, alkylphosphinic acid and glycerophosphinic acid; amino acids such as glycine and β-alanine; and hydroxyl group-having amine hydrochlorides such as triethanolamine hydrochloride and the like. Two or more of these compounds may be combined as components of the subbing layer.

After the support has been processed and/or coated with a subbing layer as above, a back surface of the support is optionally coated with a back coat layer. For the back coat layer, preferred are organic polymer compounds such as those described in JP-A No. 5-45885; and metal oxides formed by hydrolyzing and polycondensing organic or inorganic metal compounds, such as described in JP-A No. 6-35174. More preferred are silicon alkoxides such as $Si(OCH_3)_4$, $Si(OC_2H_5)_4$, $Si(OC_3H_7)_4$, and $Si(OC_4H_9)_4$, which are inexpensive and easily available. Especially preferred are coating layers of such metal oxides, which are highly resistant to developers.

One preferred characteristic of the support for the lithographic printing plate is that surface roughness thereof is between 0.10 and 1.2 μm in terms of center line average height. If this is lower than 0.10 μm, the adhesiveness between the support and the photosensitive layer formed thereon will be low, and the printing durability of the printing plate will be extremely poor. On the other hand, if the surface roughness of the support is larger than 1.2 μm, the prints formed will often be stained. Color density of the support preferably falls between 0.15 and 0.65 in terms of reflection density. If this is smaller than 0.15, that is, if the support is too white, halation thereon in image exposure will be too strong and good images cannot be formed. On the other hand, if the color density of the support is larger than 0.65, that is, if the support is too dark, the images formed will be difficult to see in a process of image inspection after development, and image inspection efficiency will be greatly lowered.

As described above, the image-recording material of the present invention can be used in producing a lithographic printing plate. An image can be recorded on the printing plate by exposing the photosensitive layer of the plate to IR radiation from an IR laser. As the case may be, image recording thereon may also be effected by exposing the photosensitive layer to a UV lamp or by thermally processing the layer with a thermal head. In the present invention, it is preferable that the photosensitive layer is imagewise exposed to IR radiation within a wavelength range of from 760 nm to 1200 nm from a solid laser or a semiconductor laser. Preferably, the laser output is at least 100 mW, and a multi-beam laser device is used for shortening time for exposure. Also preferably, the exposure time per one pixel is not longer than 20 μsec. Further preferably, the exposure energy to the recording material is between 10 and 300 $mJ/cm^2$.

After having been thus exposed to IR radiation from an IR laser, the image-recording material of the present invention is preferably developed with water or an aqueous alkali solution.

Immediately after having been exposed to such laser radiation, the photosensitive layer of the material may be directly developed, but the layer is preferably heated between a laser exposure step and a development step. With regard to heating conditions, the exposed layer is preferably heated at a temperature between 80° C. and 150° C. for a period of time from 10 seconds to 5 minutes. This heat treatment, if effected, may reduce the necessary laser energy for image exposure of the photosensitive layer.

The developer for the recording material of the present invention is preferably an aqueous alkaline solution. More preferably, the aqueous alkaline solution serving as the developer has a pH from 10.5 to 12.5, even more preferably between 11.0 and 12.5. If the pH of the aqueous alkaline solution used for the developer is less than 10.5, the non-image area of the developed layer will be stained; but if over 12.5, the mechanical strength of the image area of the developed layer will be lower.

In cases where the image-recording material of the present invention is, after exposure, developed with this aqueous alkaline solution, the developer and a replenisher for development may be any known aqueous alkaline solution. Usable, for example, are inorganic alkali salts such as sodium and potassium silicates, sodium, potassium and ammonium tertiary phosphates, sodium, potassium and ammonium secondary phosphates, sodium, potassium and ammonium carbonates, sodium, potassium and ammonium hydrogencarbonates, sodium, potassium and ammonium borates, and sodium, ammonium, potassium and lithium hydroxides. Also usable are organic alkalis such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

One or more of these alkalis may be used singly or combined.

If an automatic processor is used, it is known that the replenisher, which is the same as the developer originally in the development tank or is an aqueous solution having a higher alkali concentration than the original developer, can replenish the development tank. In the processor of this system, a large number of lithographic printing plates can be continuously processed even if the developer in the development tank is not exchanged for a long period of time. This replenishing system is favorable with the present invention.

If desired, various surfactants and organic solvents may be added to the developer and the replenisher, for promoting or retarding the development, for dispersing developer wastes, and for enhancing affinity of the image area of the developed printing plate to ink.

Preferably, the developer contains from 1 to 20% by weight, more preferably from 3 to 10% by weight of a surfactant. If the surfactant content of the developer is smaller than 1% by weight, the developability with the developer will not be satisfactorily enhanced; but a content larger than 20% by weight is unfavorable since the abrasion resistance and mechanical strength of the image area of the developed layer will be lowered.

For the surfactant, preferred are anionic, cationic, nonionic or ampholytic surfactants. Specifically, these include sodium lauryl alcohol sulfate, ammonium lauryl alcohol sulfate, sodium octyl alcohol sulfate; alkylarylsulfonates such as sodium isopropylnaphthalenesulfonate, sodium isobutylnaphthalenesulfonate, sodium polyoxyethylene glycol mononaphthylether sulfate, sodium dodecylbenzenesulfonate, sodium metanitrobenzenesulfonate; higher alcohol sulfates having from 8 to 22 carbon atoms, such as secondary sodium alkylsulfates; salts of aliphatic alcohol phosphates such as sodium cetyl alcohol phosphates; alkylamide sulfonates such as $C_{17}H_{33}CON(CH_3)CH_2CH_2SO_3Na$; dibasic aliphatic ester sulfonates such as sodium dioctyl sulfosuccinate, sodium dihexyl sulfosuccinate; ammonium salts such as lauryltrimethylammonium chloride, lauryltrimethylammonium mesosulfate; amine salts such as stearamidoethyldiethylamine acetate; polyalcohol esters such as monoesters of fatty acids with glycerol, and monoesters of fatty acids with pentaerythritol; and polyethylene glycol ethers such as polyethylene glycol mononaphthyl ether, polyethylene glycol mono (nonylphenol) ether.

Preferably, the organic solvents that may be in the developer or replenisher have solubility in water of at most about 10% by weight, more preferably at most 5% by weight. Examples thereof include 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol, and 3-methylcyclohexanol. Preferably, the organic solvent in the developer accounts for from 1 to 5% by weight of the developer in actual use. The organic solvent content of the developer is closely correlated to the surfactant content thereof. Preferably, with an increase in the organic solvent content of the developer, the surfactant content thereof increases. This is because, if the amount of the organic solvent in the developer is high when the amount of the surfactant is small, the organic solvent can not dissolve well in the developer, and the developer will not exhibit good developability.

Also, if desired, other additives such as a defoaming agent and a water softener may be added to the developer and the replenisher. The water softener includes, for example, polyphosphates such as $Na_2P_2O_7$, $Na_5P_3O_3$, $Na_3P_3O_9$, $Na_2O_4P$ $(NaO_3P)PO_3Na_2$, Calgon (sodium polymetaphosphate); aminopolycarboxylic acids and salts thereof, such as ethylenediamine-tetraacetic acid and potassium and sodium salts thereof, diethylenetriamine-pentaacetic acid and potassium and sodium salts thereof, triethylenetetramine-hexaacetic acid and potassium and sodium salts thereof, hydroxyethylethylenediamine-triacetic acid and potassium and sodium salts thereof, nitrilotriacetic acid and potassium and sodium salts thereof, 1,2-diaminocyclohexane-tetraacetic acid and potassium and sodium salts thereof, and 1,3-diamino-2-propanol-tetraacetic acid and potassium and sodium salts thereof; and organic phosphonic acids and salts thereof, such as 2-phosphonobutane-tricarboxylic acid-1,2,4 and potassium and sodium salts thereof, 2-phosphonobutane-tricarboxylic acid-2,3,4 and potassium and sodium salts thereof, 1-phosphonoethane-tricarboxylic acid-1,2,2 and potassium and sodium salts thereof, 1-hydroxyethane-1,1-diphosphonic acid and potassium and sodium salts thereof, and aminotri(methylenephosphonic acid) and potassium and sodium salts thereof. The optimum amount of the water softener in the developer varies, depending on the hardness of the water used and on the amount of the water to be in the developer. In general, the amount of the water softener in the developer in actual use may be from 0.01 to 5% by weight, preferably between 0.01 and 0.5% by weight.

In a case where the lithographic printing plates having a photosensitive layer of the recording material of the present invention are processed in such an automatic processor, the developer used becomes fatigued, depending on the number of plates processed. In such a case, a replenisher or a fresh developer may replenish the processor to thereby reactivate the developer in the processor. For this, preferably employed is the system described in U.S. Pat. No. 4,882,246.

Developers containing a surfactant, an organic solvent and a reducing agent such as those mentioned above are known. For example, JP-A No. 51-77401 discloses a developer comprising benzyl alcohol, an anionic surfactant, an alkali agent and water; JP-A No. 53-44202 discloses an aqueous developer containing benzyl alcohol, an anionic surfactant and a water-soluble sulfite; and JP-A No. 55-155355 discloses a developer containing an organic solvent, of which the solubility in water at room temperature is at most 10% by weight, an alkali agent and water. These are all favorable to the present invention.

After having been processed with a developer and a replenisher such as those mentioned above, the printing plates are post-processed with washing water, a rinsing solution that contains a surfactant, or a fat-desensitizing solution that contains gum arabic or a starch derivative. In cases where the image-recording material of the present invention is used in producing such printing plates, these post-treatments can be combined in any desired manner.

In recent art of processing printing plates and producing prints, automatic processors for printing plates are widely used for rationalizing and standardizing plate-processing operations. In general, the automatic processor is composed of a developing section and a post-processing section, and includes a unit for conveying printing plates to be processed, and processing solution tanks each equipped with a spraying unit. In these tanks, each exposed plate is conveyed horizontally and sprayed in succession with processing solutions that are pumped through spray nozzles, and is thus developed and processed. Besides this, each exposed plate can be guided in order into tanks filled with respective processing solutions, and guided therein by guide rolls, and thus developed and processed. In such automatic processors, replenishers may be replenished to the respective processing solutions, depending on the processing speed and the processing time. As the case may be, the replenishment may be automated by monitoring the electroconductivity of each processing solution with a sensor.

A processing system with no replenishment thereto is also employable, in which is used a disposable processing solution. In this, printing plates are processed with substantially unused processing solutions, with no replenisher being used.

The lithographic printing plates produced in the above manner are optionally coated with a fat-desensitizing gum, and then used in producing prints. For further enhancing printing durability, they may optionally be burned.

Prior to being burned, it is desirable that the lithographic printing plates are treated with a surface-dressing solution, for example, as in JP-B Nos. 61-2518 and 55-28062, and JP-A Nos. 62-31859 and 61-159655.

For this, for example, the lithographic printing plates may be wiped with a sponge or absorbent cotton that contains a surface-dressing solution; or they may be dipped in a surface-dressing solution in a vat; or a surface-dressing solution may be applied with an automatic coater. After having been thus coated with the surface-dressing solution, the plates are preferably squeezed with a squeegee or a squeezing roller so that the plates can be uniformly coated. This treatment produces better results.

The amount of the surface-dressing solution to be applied to the plates generally falls between 0.03 and 0.8 $g/m^2$ in terms of the dry weight of the surface-dressing agent.

The lithographic printing plates having been thus coated with the surface-dressing agent are, after being optionally dried, heated at a high temperature in a burning processor (for example, BP-1300, a burning processor marketed by Fuji Photo Film Co., Ltd.). The heating temperature and heating time in this treatment vary, depending on the image-forming components in the plates. In general, it is desirable that the plates are heated at a temperature between 180 and 300° C., for 1 to 20 minutes.

After having been thus burned, the lithographic printing plates may be washed with water, gummed and the like in a conventional manner as necessary. In cases where the plates are treated with a surface-dressing solution that contains a water-soluble polymer compound before being burned, a fat-desensitization treatment, for example, the treatment of gumming, may be omitted.

The lithographic printing plate thus produced by this process as above is set in an offset printer and used for producing a large number of prints.

EXAMPLES

The present invention is described in detail with reference to the following Examples, which, however, are not intended to restrict the scope of the present invention.

Examples 1 to 6

Preparation of Support

A melt of JIS A1050 alloy of at least 99.5% Al, containing 0.30% Fe, 0.10% Si, 0.02% Ti and 0.013% Cu was purified and cast. For purifying, the alloy melt was degassed to remove unnecessary gas such as hydrogen therefrom, and filtered through a ceramic tube filter. The alloy melt was cast by DC casting. A solidified ingot having a thickness of 500 mm was cut to a depth of 10 mm from the surface, and then homogenized at 550° C. for 10 hours to prevent intermetallic compounds therein from growing into coarse grains. Next, this was hot-rolled at 400° C., then annealed in a continuous annealing furnace at 500° C. for 60 seconds (process annealing), and thereafter cold-rolled into an aluminum sheet having a thickness of 0.30 mm. Here, the surface roughness of the roll was controlled such that the center line average height, Ra, of the cold-rolled aluminum sheet would be 0.2 $\mu$m. The aluminum sheet was leveled with a tension leveler to thereby further increase surface smoothness.

Next, the aluminum sheet was subjected to surface treatment in the manner mentioned below, so that it could be a support of a lithographic printing plate.

Specifically, for removing rolling oil from the surface, the aluminum sheet was degreased with an aqueous 10% sodium aluminate solution at 50° C. for 30 seconds, then neutralized with aqueous 30% sulfuric acid at 50° C. for 30 seconds, and then desmutted.

Next, the surface of the aluminum sheet was electrolytically dressed and roughened. This was for improving the adhesiveness between the aluminum sheet serving as the support and a photosensitive layer to be formed thereon, and for ensuring water retentiveness of a non-image area of a printing plate having the aluminum sheet as a support. Specifically, an aqueous solution containing 1% nitric acid and 0.5% aluminum nitrate was prepared and kept at 45° C., and a web of the aluminum sheet was passed therethrough while applying an alternating electric current (duty ratio: 1/1) to the solution from an indirect electric cell. The current density was 20 A/dm$^2$; and the electric power to the anode was 240 C/dm$^2$. After having been thus dressed, the aluminum sheet web was etched in an aqueous 10% sodium aluminate solution at 50° C. for 30 seconds, then neutralized in an aqueous 30% sulfuric acid solution at 50° C. for 30 seconds, and thereafter desmutted.

For improving abrasion resistance, chemical resistance and water retentiveness, the aluminum sheet web was subjected to anodic oxidation to form an oxide film thereon. Specifically, the a aluminum sheet web was passed through an aqueous electrolytic solution of 20% sulfuric acid at 35° C. and electrolyzed therein with a direct current of 14 A/cm$^2$ being applied to the solution from an indirect electric cell. By this anodic oxidation, the aluminum sheet web had an oxide film of 2.5 g/m$^2$ formed thereon.

Next, this was treated with a silicate. This treatment is for ensuring hydrophilicity of the non-image area of the printing plate having the aluminum sheet as the support. Specifically, the aluminum sheet web was passed through an aqueous 1.5% sodium silicate (#3) solution at 70° C. Contact time was 15 seconds. Then, the web was washed with water. The amount of Si deposited on the web was 10 mg/m$^2$. The center line average height, Ra, of the thus-processed aluminum sheet was 0.25 $\mu$m. The aluminum sheet served as the support of the printing plate that was produced.

Subbing Layer

Next, the aluminum support was coated with a subbing solution (composition shown below) by use of a wire bar, and dried with a hot air drier at 90° C. for 30 seconds. After drying, the thickness of the subbing layer formed was 10 mg/m$^2$.

Subbing Solution

| | |
|---|---|
| 75/15 by mol copolymer of ethyl methacrylate and sodium 2-acrylamido-2-methyl-1-propanesulfonate | 0.1 g |
| 2-aminoethylphosphonic acid | 0.1 g |
| Methanol | 50 g |
| Ion-exchange water | 50 g |

Photosensitive Layer

Next, a photosensitive solution [P] (composition shown below) was prepared. Immediately after preparation, the solution [P] was applied to the subbing layer-coated aluminum sheet by use of a wire bar, and then dried with a hot air drier at 115° C. for 45 seconds. In this manner, plates [P-1] to [P-6] to be processed into negative lithographic printing plates were produced. After drying, the amount of the photosensitive layer formed on each plate was 1.3 g/m$^2$. IR absorbers and onium salts used in the photosensitive solution [P] are shown in Table 1. The reflection density at an absorption peak in the IR range of the photosensitive layer of each plate was measured. For all plates, the reflection density fell between 0.6 and 1.2.

Coating Solution [P] for Photosensitive Layer

| | |
|---|---|
| IR absorber (shown in Table 1) | 0.10 g |
| Onium salt (shown in Table 1) | 0.30 g |
| Dipentaerythritol hexaacrylate | 1.00 g |
| 80/20 by mol copolymer of allyl methacrylate and methacrylic acid, (weight-average molecular weight: 120,000) | 1.00 g |
| Victoria Pure Blue naphthalenesulfonate | 0.04 g |
| Fluorine-containing surfactant (MEGAFAC F-176, manufactured by Dai-Nippon Ink and Chemicals Inc.) | 0.01 g |
| Methyl ethyl ketone | 9.0 g |
| Methanol | 10.0 g |
| 1-Methoxy-2-propanol | 8.0 g |

TABLE 1

| | Lithographic Printing Plate | IR Absorber | Onium Salt |
|---|---|---|---|
| Example 1 | [P-1] | [IR-1] | [OI-5] |
| Example 2 | [P-2] | [IR-1] | [ON-2] |

TABLE 1-continued

| | Lithographic Printing Plate | IR Absorber | Onium Salt |
|---|---|---|---|
| Example 3 | [P-3] | [IR-8] | [OS-4] |
| Example 4 | [P-4] | [IR-3] | [OI-5] |
| Example 5 | [P-5] | [IR-5] | [OI-5] |
| Example 6 | [P-6] | [IR-8] | [OI-2] |
| Comp. Ex. 1 | [Q-1] | IR-786 perchlorate | [OI-5] |
| Comp. Ex. 2 | [Q-2] | | [ON-2] |
| Comp. Ex. 3 | [Q-3] | | [OS-4] |

Exposure

The negative lithographic printing plates [P-1] to [P-6] were imagewise exposed to IR radiation, using TRENDSETTER 3244VFS, manufactured by Creo, with a water-cooled 40 W IR semiconductor laser mounted therein. Output power was 9 W; drum speed was 210 rpm; energy at the plate was 100 mJ/cm$^2$; and image resolution was 2400 dpi.

Development

After having been thus exposed, the plates were processed by use of an automatic processor, STABLON 900 N, manufactured by Fuji Photo Film Co., Ltd. For both an original developer and a replenisher, DN-3C, manufactured by Fuji Photo Film Co., Ltd., was used, diluted 1/1 with water. The temperature of a developer bath was 30° C. For a finisher, FN-6, manufactured by Fuji Photo Film Co., Ltd., was used, diluted 1/1 with water (pH=10.8).

Evaluation of Printability of Printing Plates

The thus-processed lithographic printing plates [P-1] to [P-6] were tested for printability. Specifically, each printing plate was set in a Heidelberg printer, HEIDEL SOR-M, which was driven to produce prints with commercially-available oily ink. The prints were visually checked for stains in non-image areas. The results are given in Table 2. No stains were found in all prints from all the printing plates tested.

Number of Good Prints

Next, the lithographic printing plates [P-1] to [P-6] were tested in a printer produced by Komori Corporation, LITHLON, to check how many good prints could be obtained therefrom. Specifically, all the prints were visually checked for ink density, and the number of good prints from each printing plate tested was counted. The results are given in Table 2.

Comparative Examples 1 to 3

After having been thus exposed, the plates were processed by use of an automatic processor, STABLON 900 N, manufactured by Fuji Photo Film Co., Ltd. For both an original developer and a replenisher, DN-3C, manufactured by Fuji Photo Film Co., Ltd., was used, diluted 1/1 with water. The temperature of a developer bath was 30° C. For a finisher, FN-6, manufactured by Fuji Photo Film Co., Ltd., was used, diluted 1/1 with water (pH=10.8).

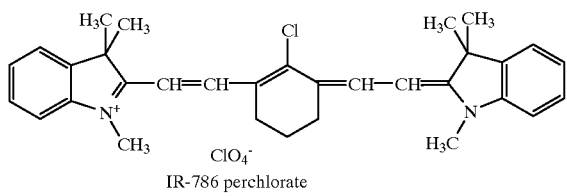

IR-786 perchlorate

These plates [Q-1] to [Q-3] were exposed and processed in the same manner as in Examples 1 to 6 into lithographic printing plates [Q-1] to [Q-3]. Also in the same manner as in Examples 1 to 6, these printing plates were tested for their printability. Prints therefrom were visually checked for stains in non-image areas. The results are given in Table 2.

TABLE 2

| | Lithographic Printing Plate | Stains in Non-image Area | Number of Good Prints |
|---|---|---|---|
| Example 1 | [P-1] | no | 55,000 |
| Example 2 | [P-2] | no | 60,000 |
| Example 3 | [P-3] | no | 50,000 |
| Example 4 | [P-4] | no | 65,000 |
| Example 5 | [P-5] | no | 60,000 |
| Example 6 | [P-6] | no | 55,000 |
| Comp. Ex. 1 | [Q-1] | no | 40,000 |
| Comp. Ex. 2 | [Q-2] | slight | 40,000 |
| Comp. Ex. 3 | [Q-3] | no | 25,000 |

As is obvious from Table 2, the lithographic printing plates of the present invention, in which the photosensitive layer contained an IR absorber having a low oxidation potential, gave a larger number of good prints with no stains in the non-image area, even though they were imagewise exposed and then developed and processed without being heated after the exposure. However, the number of good prints from the Comparative Example printing plates, in which the IR absorber in the photosensitive layer was outside the scope of the present invention, was smaller than the number from the printing plates of the present invention.

Examples 7 and 8

A photosensitive solution [P] was prepared in the same manner as in Examples 1 to 3, but an IR absorber manufactured by Sigma Aldrich Japan, IR-786 perchlorate (oxidation potential: 0.53 V vs. SCE), was used in place of the IR absorbers of the present invention. A coating solution thus prepared was applied to the aluminum sheet supports, and dried. The Comparative Example lithographic printing plates thus produced herein are referred to as [Q-1] to [Q-3]. Details of the onium salts used therein are shown in Table 1.

Coating Solution [R] for photosensitive layer

| | |
|---|---|
| IR absorber (shown in Table 3) | 0.10 g |
| Onium salt (shown in Table 3) | 0.30 g |
| Polyfunctional monomer (structure shown below) | 1.00 g |
| Addition copolymer of 4,4'-diphenylmethane diisocyanate, hexamethylene diisocyanate, tetraethylene glycol, and 2,-bis(hydroxymethyl)propionic acid, 30/20/30/20 by mol (weight-average molecular weight: 60,000) | 1.00 g |
| Victoria Pure Blue naphthalenesulfonate | 0.04 g |
| Fluorine-containing surfactant (MEGAFAC F-176, manufactured by Dai-Nippon Ink and Chemicals Inc.) | 0.01 g |
| Methyl ethyl ketone | 5.0 g |
| Methanol | 10.0 g |
| 1-methoxy-2-propanol | 8.0 g |
| Methyl lactate | 2.0 g |
| γ-butyrolactone | 2.0 g |

Structural formula of monomer

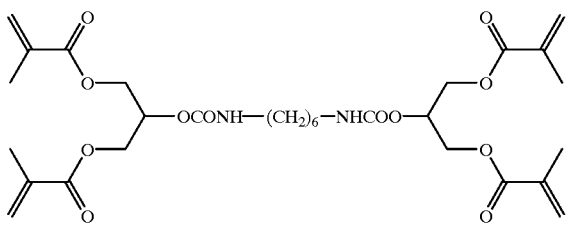

TABLE 3

| Lithographic Printing Plate | IR Absorber | Onium Salt |
|---|---|---|
| Example 7 | [R-1] | [IR-1] | [OI-2] |
| Example 8 | [R-2] | [IR-8] | [OS-6] |
| Comp. Ex. 4 | [S-1] | IR-786 perchlorate | [OS-6] |

Exposure

The negative lithographic printing plates [R-1] and [R-2] were imagewise exposed to IR radiation, using LUXEL T-9000CTP, manufactured by Fuji Photo Film Co., Ltd., with a multi-channel laser head mounted therein. The output power was 250 mW/beam; the drum speed was 800 rpm; and the image resolution was 2400 dpi.

After having been thus exposed, the plates were processed in the same manner as in Examples 1 to 6 into lithographic printing plates [R-1] and [R-2]. Also in the same manner as in Examples 1 to 6, these printing plates [R-1] and [R-2] were tested for printability, and the number of good prints therefrom was counted. The results are given in Table 4 below.

Comparative Example 4

A photosensitive solution [R] was prepared in the same manner as in Examples 7 and 8, but the IR absorber manufactured by Sigma Aldrich Japan, IR-768 perchlorate (oxidation potential: 0.49 V vs. SCE, structure shown below), was used in place of the JR absorber of the present invention. Immediately after preparation, the coating solution was applied to the same aluminum support as in Examples 7 and 8, and dried. The Comparative Example lithographic printing plate thus produced is referred to as [S-1]. The details of the onium salt used therein are shown in Table 3.

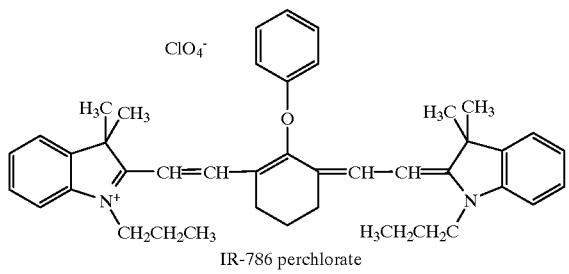

IR-786 perchlorate

The plate [S-1] was exposed and processed in the same manner as in Examples 7 and 8 into a lithographic printing plate [S-1]. Also in the same manner as in Examples 7 and 8, the printing plate was tested for printability. Prints therefrom were visually checked for stains in the non-image area.

The results are given in Table 4.

TABLE 4

| | Lithographic Printing Plate | Stains in Non-image Area | Number of Good Prints |
|---|---|---|---|
| Example 7 | [R-1] | no | 45,000 |
| Example 8 | [R-2] | no | 40,000 |
| Comp. Ex. 4 | [S-1] | no | 15,000 |

As is obvious from Table 4, the lithographic printing plates of the present invention, [R-1] and [R-2] gave a larger number of good prints with no stains in non-image areas.

However, the number of good prints from the comparative printing plate, [S-1] which differed from the printing plates of the present invention only in that the IR absorber in the photosensitive layer was outside the scope of the present invention, was smaller than the numbers from the printing plates of the present invention.

Examples 9 to 12, Comparative Examples 5, 6

Preparation of Support

An aluminum support was formed in the same manner as in Examples 1 to 6, except that the support was not subjected to the silicate treatment for hydrophilicity.

Subbing Layer

Next, the aluminum support was coated with a subbing solution (composition shown below) by use of a wire bar, and dried with a hot air drier at 90° C. for 30 seconds. After drying, the thickness of the subbing layer formed was 10 mg/m$^2$.

Subbing Solution

| β-alanine | 0.1 g |
|---|---|
| Phenylphosphonic acid | 0.1 g |
| Methanol | 40 g |
| Pure water | 60 g |

Photosensitive Layer

A photosensitive solution [P] was prepared in the same manner as in Examples 1 to 6, except that the IR absorbers and onium salts shown in Table 5 below were used. Also in the same manner as in Examples 1 to 6, the coating solution thus prepared was applied to the subbing layer-coated aluminum sheet by the use of a wire bar, and then dried. In this manner, plates [P-9] to [P-12] and [Q-5] and [Q-6] to be processed into negative lithographic printing plates were produced.

A photosensitive solution [P] was prepared in the same manner as in Examples 1 to 6, except that the IR absorbers and onium salts shown in Table 5 below were used. Also in the same manner as in Examples 1 to 6, the coating solution thus prepared was applied to the subbing layer-coated aluminum sheet by the use of a wire bar, and then dried. In this manner, plates [P-9] to [P-12] and [Q-5] and [Q-6] to be processed into negative lithographic printing plates were produced.

TABLE 5

| | Lithographic Printing Plate | IR Absorber | Onium Salt |
|---|---|---|---|
| Example 9 | [P-9] | [IR-1] | [OI-5] |
| Example 10 | [P-10] | [IR-5] | [OI-5] |

TABLE 5-continued

|  | Lithographic Printing Plate | IR Absorber | Onium Salt |
| --- | --- | --- | --- |
| Example 11 | [P-11] | [IR-10] | [OS-6] |
| Example 12 | [P-12] | [IR-12] | [OS-6] |
| Comp. Ex. 5 | [Q-5] | IR-786 | [OI-5] |
| Comp. Ex. 6 | [Q-6] | IR-768 | [OS-6] |

Plates [S-1] were exposed and processed in the same manner as in Examples 1 to 6, except that the following developer was used. Thus, the lithographic printing plates [P-9] to [P-12] and [Q-5] and [Q-6] were obtained.
Developer

| Potassium hydroxide | 3.8 g |
| --- | --- |
| Polyethylene glycol mononaphthyl ether | 250 g |
| Sodium ethylenediaminetetraacetate | 8 g |
| Water | 738 g |
| (pH = 11.7) | |

Also in the same manner as in Examples 1 to 6, these printing plates were tested for printability. The prints therefrom were visually checked for stains in non-image areas. The results are given in Table 6.

TABLE 6

|  | Lithographic Printing Plate | Stains in Non-image Area | Number of Good Prints |
| --- | --- | --- | --- |
| Example 9 | [P-9] | No | 65,000 |
| Example 10 | [P-10] | No | 70,000 |
| Example 11 | [P-11] | No | 65,000 |
| Example 12 | [P-12] | No | 60,000 |
| Comp. Ex. 5 | [Q-5] | No | 45,000 |
| Comp. Ex. 6 | [Q-6] | No | 40,000 |

As is obvious from Table 6, the lithographic printing plates of the present invention, [P-9] to [P-12] gave a larger number of good prints with no stains in non-image areas.

However, the numbers of good prints from the printing plates of Comparative Examples 5 and 6, which differed from the printing plates of Examples 9 and 11 of the present invention only in that the IR absorber in the photosensitive layer in the former was outside the scope of the present invention, were smaller than the numbers from the printing plates of the present invention.

Reference Example 1

The plate [P-10] of Example 10 was exposed and processed into a lithographic printing plate in the same manner as in Example 10, except that a developer manufactured by Fuji Photo Film Co., Ltd., HD-P2 (pH=13.3), was used. Compared with the lithographic printing plate of Example 10 in which the pH of the developer used for processing the plate was within the above-mentioned preferred range, the printing durability of an image area of the printing plate of this Reference Example 1 was low and the non-image area of the printing plate stained a little.

Reference Example 2

The plate [P-10] of Example 10 was exposed and processed into a lithographic printing plate in the same manner as in Example 10, except that a standard buffer manufactured by Wako Pure Chemicals Inc. (pH=10.01) was used as the developer. Compared with the plate processed with the preferred developer in Example 10, the non-image area in this plate did not dissolve completely, and the prints from the printing plate of this Reference Example 2 stained a little.

Reference Example 3

The plate [P-3] of Example 3 was, after being heated on a hot plate at 160° C. for 90 seconds, processed in the same manner as in Examples 1 to 6. Due to curing by this heat treatment, the photosensitive layer of the plate [P-3] did not dissolve in development, like the image area of the photosensitive layer of the plate of Example 3. It can be seen from this that image formation on the layer of the negative image-recording material of the present invention is not limited only to exposure with IR lasers but may be effected through direct heating of the layer with a thermal head or the like.

Reference Example 4

The plate [P-3] of Example 3 was exposed to a xenon lamp via a glass filter manufactured by Toshiba Glass, R-69, disposed between the plate and the lamp. Measured with a power meter manufactured by Advantest at a determined wavelength of 830 nm, a quantity of light on the surface of the plate was 100 mW. After having been thus exposed for 60 seconds (corresponding to an exposure amount of 6000 mJ/cm$^2$), the plate was processed in the same manner as in Examples 1 to 6. The photosensitive layer dissolved completely, leaving no film corresponding to the image area. From this, it is understood that substantially no image is formed on the layer of the negative image-recording material of the present invention through photon-mode exposure, and the recording material of the present invention requires heat-mode exposure for image formation thereon.

The present invention provides a negative image-recording material which can be imagewise-exposed to IR radiation from an IR-emitting solid laser or semiconductor laser and which enables direct image formation thereon from digital data of a computer or the like, and which, when used in a lithographic printing plate, exhibits good printing durability, even if not heated for image formation thereon, and ensures a large number of good prints from the printing plate.

What is claimed is:

1. A negative image-recording material for heat-mode exposure, the material comprising: (A) an IR absorber having an oxidation potential of at most 0.45 V (vs. SCE); (B) a thermal radical generator; and (C) a radical-polymerizing compound, the material being recordable by exposure with IR radiation.

2. The negative image-recording material as claimed in claim 1, wherein the oxidation potential of the IR absorber is from 0.10 to 0.40 V (vs. SCE).

3. The negative image-recording material as claimed in claim 2, wherein the IR absorber has, in a chromophoric group thereof, an electron-donating substituent having a Hammett's σpara value of at most −0.10.

4. The negative image-recording material as claimed in claim 3, wherein the electron-donating substituent is selected from the group consisting of a methyl group, an ethyl group, a propyl group, a hydroxyl group, a methoxy group, an ethoxy group, a propyloxy group, a butoxy group, a phenoxy group, a toluyloxy group, an amino group, a methylamino group, an ethylamino group, a butylamino group, a dimethylamino group, a diethylamino group, a phenylamino group, and a diphenylamino group.

5. The negative image-recording material as claimed in claim 2, wherein (B) the thermal radical generator is an onium salt.

6. The negative image-recording material as claimed in claim 5, wherein the onium salt has an absorption peak at a wavelength of at most 360 nm.

7. The negative image-recording material as claimed in claim 5, wherein (C) the radical-polymerizing compound has at least one ethylenically unsaturated double bond.

8. The negative image-recording material as claimed in claim 2, wherein (C) the radical-polymerizing compound has at least one ethylenically unsaturated double bond.

9. The negative image-recording material as claimed in claim 1, wherein the oxidation potential of the IR absorber is from 0.10 to 0.35 V (vs. SCE).

10. The negative image-recording material as claimed in claim 1, wherein the IR absorber has, in a chromophoric group thereof, an electron-donating substituent having a Hammett's σpara value of at most −0.10.

11. The negative image-recording material as claimed in claim 10, wherein the electron-donating substituent is selected from the group consisting of a methyl group, an ethyl group, a propyl group, a hydroxyl group, a methoxy group, an ethoxy group, a propyloxy group, a butoxy group, a phenoxy group, a toluyloxy group, an amino group, a methylamino group, an ethylamino group, a butylamino group, a dimethylamino group, a diethylamino group, a phenylamino group, and a diphenylamino group.

12. The negative image-recording material as claimed in claim 1, wherein (B) the thermal radical generator is an onium salt.

13. The negative image-recording material as claimed in claim 8, wherein the onium salt has an absorption peak at a wavelength of at most 400 nm.

14. The negative image-recording material as claimed in claim 1, wherein (C) the radical-polymerizing compound has at least one ethylenically unsaturated double bond.

15. The negative image-recording material as claimed in claim 1, the IR absorber is a dye represented by the following general formula (D1), (D1)

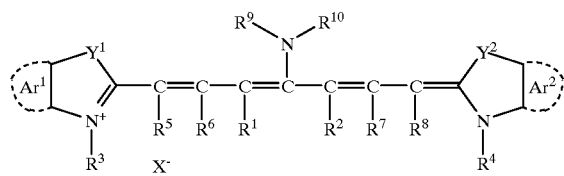

wherein, $R^1$ and $R^2$ each independently represents a hydrogen atom or a hydrocarbon group having from 1 to 12 carbon atoms; and $R^1$ and $R^2$ may be bonded to each other to form a ring structure; $Ar^1$ and $Ar^2$ may be the same or different, and each represents an optionally-substituted aromatic hydrocarbon group; $Y^1$ and $Y^2$ may be the same or different, and each represents a sulfur atom or a dialkylmethylene group having at most 12 carbon atoms; $R^3$ and $R^4$ may be the same or different, and each represents an optionally-substituted hydrocarbon group having at most 20 carbon atoms; $R^5$, $R^6$, $R^7$ and $R^8$ may be the same or different, and each represents a hydrogen atom or a hydrocarbon group having at most 12 carbon atoms; $R^9$ and $R^{10}$ may be the same or different, and each represents an optionally-substituted aromatic hydrocarbon group having from 6 to 10 carbon atoms, an alkyl group having from 1 to 8 carbon atoms, or a hydrogen atom; and $R^9$ and $R^{10}$ may be bonded to each other to form any of the following cyclic structures,

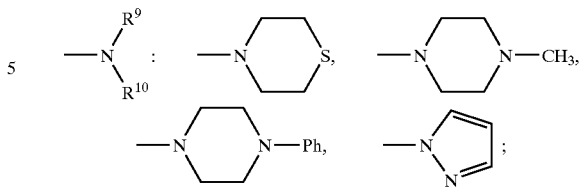

and X represents a counter anion.

16. The negative image-recording material as claimed in claim 1, the IR absorber is a dye represented by the following general formula (D2), (D2)

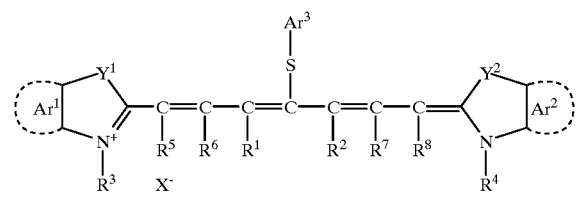

wherein, $R^1$ and $R^2$ each independently represents a hydrogen atom or a hydrocarbon group having from 1 to 12 carbon atoms; and $R^1$ and $R^2$ may be bonded to each other to form a ring structure; $Ar^1$ and $Ar^2$ may be the same or different, and each represents an optionally-substituted aromatic hydrocarbon group; $Y^1$ and $Y^2$ may be the same or different, and each represents a sulfur atom or a dialkylmethylene group having at most 12 carbon atoms; $R^3$ and $R^4$ may be the same or different, and each represents an optionally-substituted hydrocarbon group having at most 20 carbon atoms; $R^5$, $R^6$, $R^7$ and $R^8$ may be the same or different, and each represents a hydrogen atom or a hydrocarbon group having at most 12 carbon atoms; $Ar^3$ represents a mono- or poly-heterocyclic group having at least one atom of nitrogen, oxygen or sulfur; and $X^-$ represents a counter anion.

17. The negative image-recording material as claimed in claim 1, the IR absorber is a dye represented by the following general formula (D3), (D3)

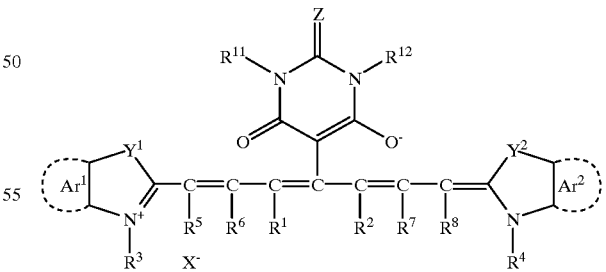

wherein $R^1$ and $R^2$ each independently represents a hydrogen atom or a hydrocarbon group having from 1 to 12 carbon atoms; and $R^1$ and $R^2$ may be bonded to each other to form a ring structure; $Ar^1$ and $Ar^2$ may be the same or different, and each represents an optionally-substituted aromatic hydrocarbon group; $Y^1$ and $Y^2$ may be the same or different, and each represents a sulfur atom or a dialkylmethylene group having at most 12 carbon atoms; $R^3$ and $R^4$ may be the same or different, and each represents an optionally-substituted hydrocarbon group having at most 20 carbon atoms; $R^5$, $R^6$, $R^7$ and $R^8$ may be the same or different, and each represents a hydrogen atom or a hydrocarbon group having at most 12 carbon atoms; $R^{11}$ and $R^{12}$ may be the same or different, and each represents a hydrogen atom, an allyl group, a cyclohexyl group, or an alkyl group having from 1 to 8 carbon atoms; Z represents an oxygen or sulfur atom.

18. The negative image-recording material as claimed in claim 1, the IR absorber is a betaine-type dye which does not have a positive charge.

19. A method of image formation comprising the steps of:
providing a lithographic printing plate having, on a support, a recording layer formed of a negative image-recording material for heat-mode exposure, the material comprising (A) an IR absorber having an oxidation potential of at most 0.45 V (vs. SCE), (B) a thermal radical generator and (C) a radical-polymerizing compound;
imagewise-exposing the lithographic printing plate with IR radiation; and
developing the lithographic printing plate with an aqueous alkaline liquid having a pH of from 10.5 to 12.5.

20. The method of image formation as claimed in claim 19, wherein the oxidation potential of the IR absorber (A) is from 0.10 to 0.40 V (vs. SCE).

21. The method of image formation as claimed in claim 20, wherein (A) the IR absorber has, in a chromophoric group thereof, an electron-donating substituent having a Hammett's σpara value of at most −0.10.

22. The method of image formation as claimed in claim 19, wherein (A) the IR absorber has, in a chromophoric group thereof, an electron-donating substituent having a Hammett's σpara value of at most −0.10.

23. The method of image formation as claimed in claim 19, wherein (B) the thermal radical generator is an onium salt.

24. The method of image formation as claimed in claim 19, wherein (C) the radical-polymerizing compound has at least one ethylenically unsaturated double bond.

* * * * *